(12) United States Patent
Weiss

(10) Patent No.: US 8,335,081 B2
(45) Date of Patent: Dec. 18, 2012

(54) HEAT SINK COOLING ARRANGEMENT FOR MULTIPLE POWER ELECTRONIC CIRCUITS

(75) Inventor: Bruce W. Weiss, Milwaukee, WI (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 235 days.

(21) Appl. No.: 12/837,671

(22) Filed: Jul. 16, 2010

(65) Prior Publication Data

US 2012/0014063 A1    Jan. 19, 2012

(51) Int. Cl.
H05K 7/20    (2006.01)

(52) U.S. Cl. .................. 361/694; 361/679.51; 361/696; 361/697; 361/710; 312/223.1; 165/80.3

(58) Field of Classification Search ........... 361/679.46–679.51, 679.54, 692, 361/694, 695–704, 707, 709, 710, 730
See application file for complete search history.

(56) References Cited

U.S. PATENT DOCUMENTS

| | | |
|---|---|---|
| 4,699,208 A | 10/1987 | Wolf et al. |
| 4,728,160 A | 3/1988 | Mondor et al. |
| 5,398,159 A | 3/1995 | Andersson et al. |
| 5,414,591 A | 5/1995 | Kimura et al. |
| 5,485,350 A | 1/1996 | Hecht et al. |
| 5,547,272 A | 8/1996 | Paterson et al. |
| 5,684,671 A | 11/1997 | Hobbs et al. |
| 6,039,414 A | 3/2000 | Melane et al. |
| 6,104,608 A | 8/2000 | Casinelli et al. |
| 6,164,369 A | 12/2000 | Stoller |
| 6,493,227 B2 | 12/2002 | Nielsen et al. |
| 6,504,714 B1 | 1/2003 | Richter |
| 6,628,520 B2 | 9/2003 | Patel et al. |
| 6,742,068 B2 | 5/2004 | Gallagher et al. |
| 6,819,563 B1 | 11/2004 | Chu et al. |
| 6,867,970 B2 | 3/2005 | Muller et al. |
| 6,875,101 B1 | 4/2005 | Chien |
| 6,876,549 B2 | 4/2005 | Beitelmal et al. |
| 6,889,752 B2 | 5/2005 | Stoller |
| 6,931,756 B2 * | 8/2005 | Morgan et al. .................. 34/202 |
| 6,961,242 B2 | 11/2005 | Espinoza-Ibarra et al. |
| 7,016,191 B2 | 3/2006 | Miyamoto et al. |
| 7,046,513 B2 | 5/2006 | Nishiyama et al. |
| 7,079,379 B2 * | 7/2006 | Yamaguchi et al. .......... 361/676 |
| 7,218,516 B2 | 5/2007 | Yu et al. |
| 7,226,353 B2 | 6/2007 | Bettridge et al. |
| 7,630,198 B2 | 12/2009 | Doll |
| 7,701,712 B2 | 4/2010 | Kramer |
| 7,813,121 B2 | 10/2010 | Bisson et al. |
| 7,813,129 B2 | 10/2010 | Van Der Werff |
| 7,826,216 B2 | 11/2010 | Moss |

(Continued)

*Primary Examiner* — Courtney Smith
(74) *Attorney, Agent, or Firm* — Fletcher Yoder P.C.; Alexander R. Kuszewski; John M. Miller

(57) ABSTRACT

The present invention relates generally to tuning the flow of cooling air across converter and inverter heat sinks in a motor drive system. More specifically, present techniques relate to motor drive duct systems including heat sinks with separate, sequential heat sink fin sections disposed in a common cooling air path and having different geometries to optimize the flow of cooling air across and between fins of the separate heat sink fin sections. For example, the heat sink fin sections may have different fin lengths, fin heights, fin counts, fin pitch (e.g., distance between adjacent fins), and so forth. Each of these different geometric characteristics may be tuned to ensure that temperatures and temperature gradients across the heat sinks are maintained within acceptable ranges.

23 Claims, 12 Drawing Sheets

U.S. PATENT DOCUMENTS

| | | |
|---|---|---|
| 7,862,410 B2 | 1/2011 | McMahan et al. |
| 7,898,810 B2 * | 3/2011 | Mason et al. ............... 361/717 |
| 7,903,403 B2 | 3/2011 | Doll et al. |
| 8,081,465 B2 * | 12/2011 | Nishiura ..................... 361/703 |
| 2003/0053293 A1 | 3/2003 | Beitelmal et al. |
| 2004/0223301 A1 | 11/2004 | Muller et al. |
| 2005/0207134 A1 * | 9/2005 | Belady et al. ............... 361/796 |
| 2006/0054380 A1 | 3/2006 | Doll |
| 2008/0310109 A1 * | 12/2008 | Park et al. ................... 361/697 |
| 2009/0268405 A1 | 10/2009 | Kaveh |
| 2010/0091434 A1 * | 4/2010 | Pereira et al. ............... 361/677 |
| 2010/0118488 A1 * | 5/2010 | Hoffman et al. ............. 361/691 |
| 2010/0118493 A1 | 5/2010 | Huang et al. |
| 2011/0110039 A1 * | 5/2011 | Feltner et al. ............... 361/695 |
| 2011/0255237 A1 * | 10/2011 | Doll ........................ 361/679.46 |

* cited by examiner

HEAT SINK COOLING ARRANGEMENT FOR MULTIPLE POWER ELECTRONIC CIRCUITS

BACKGROUND

The present invention relates generally to the field of power electronic devices such as those used in power conversion or applying power to motors and similar loads. More particularly, the invention relates to optimizing the flow of cooling air across motor drive heat sinks.

In the field of power electronic devices, a wide range of circuitry is known and currently available for converting, producing, and applying power to loads. Depending upon the application, such circuitry may convert incoming power from one form to another as needed by the load. In a typical arrangement, for example, constant (or varying) frequency alternating current power (such as from a utility grid or generator) is converted to controlled frequency alternating current power to drive motors, and other loads. In this type of application, the frequency of the output power can be regulated to control the speed of the motor or other device. Many other applications exist, however, for power electronic circuits which can convert alternating current power to direct current power (or vice versa) or that otherwise manipulate, filter, or modify electric signals for powering a load. Circuits of this type generally include rectifiers (converters), inverters, and similar switched circuitry. For example, a motor drive will typically include a rectifier that converts AC power to DC. Power conditioning circuits, such as capacitors and/or inductors, are often employed to remove unwanted voltage ripple on the internal DC bus. Inverter circuitry can then convert the DC signal into an AC signal of a particular voltage and frequency desired for driving a motor at a particular speed or torque. The inverter circuitry typically includes several high power semiconductor devices, such as insulated-gate bipolar transistors (IGBTs), silicon controlled rectifiers (SCRs) and diodes controlled by drive circuitry.

The power semiconductors detailed above will typically generate substantial amounts of heat, which must be dissipated to avoid damaging heat sensitive electronics. Typically, therefore, some form of cooling mechanism may be employed to enhance heat extraction and dissipation. Often, the circuitry is packaged together as a unit with a built-in cooling channel that provides cool air to several components. It is now recognized that, because the air within the channel is heated as it travels through the channel, components near the exhaust end of the air channel will usually experience a diminished cooling effect. Therefore, as packaged control units become more compact, the need for efficient heat dissipation becomes more critical. Additionally, as the workload or motor speed changes, the temperature of the semiconductors generally increases, causing higher failure rates and reduced reliability. The output of the unit is often, therefore, limited by the maximum temperature that the unit can handle without substantially increasing the risk of failure. A more effective cooling mechanism would, therefore, allow the motor drive to operate at higher motor power levels. Therefore, it may be advantageous to provide a motor drive with an improved cooling mechanism. In particular, it may be advantageous to provide a cooling mechanism which provides a reduced air flow resistance and increased air flow while maintaining a high level of thermal performance.

BRIEF DESCRIPTION

The present invention relates generally to tuning the flow of cooling air across converter and inverter heat sinks in a motor drive system. More specifically, present techniques relate to motor drive duct systems including heat sinks with separate, sequential heat sink fin sections disposed in a common cooling air path and having different geometries to optimize the flow of cooling air across and between fins of the separate heat sink fin sections. For example, the heat sink fin sections may have different fin lengths, fin heights, fin counts, fin pitch (e.g., distance between adjacent fins), and so forth. Each of these different geometric characteristics may be tuned to ensure that temperatures and temperature gradients across the heat sinks are maintained within acceptable ranges.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
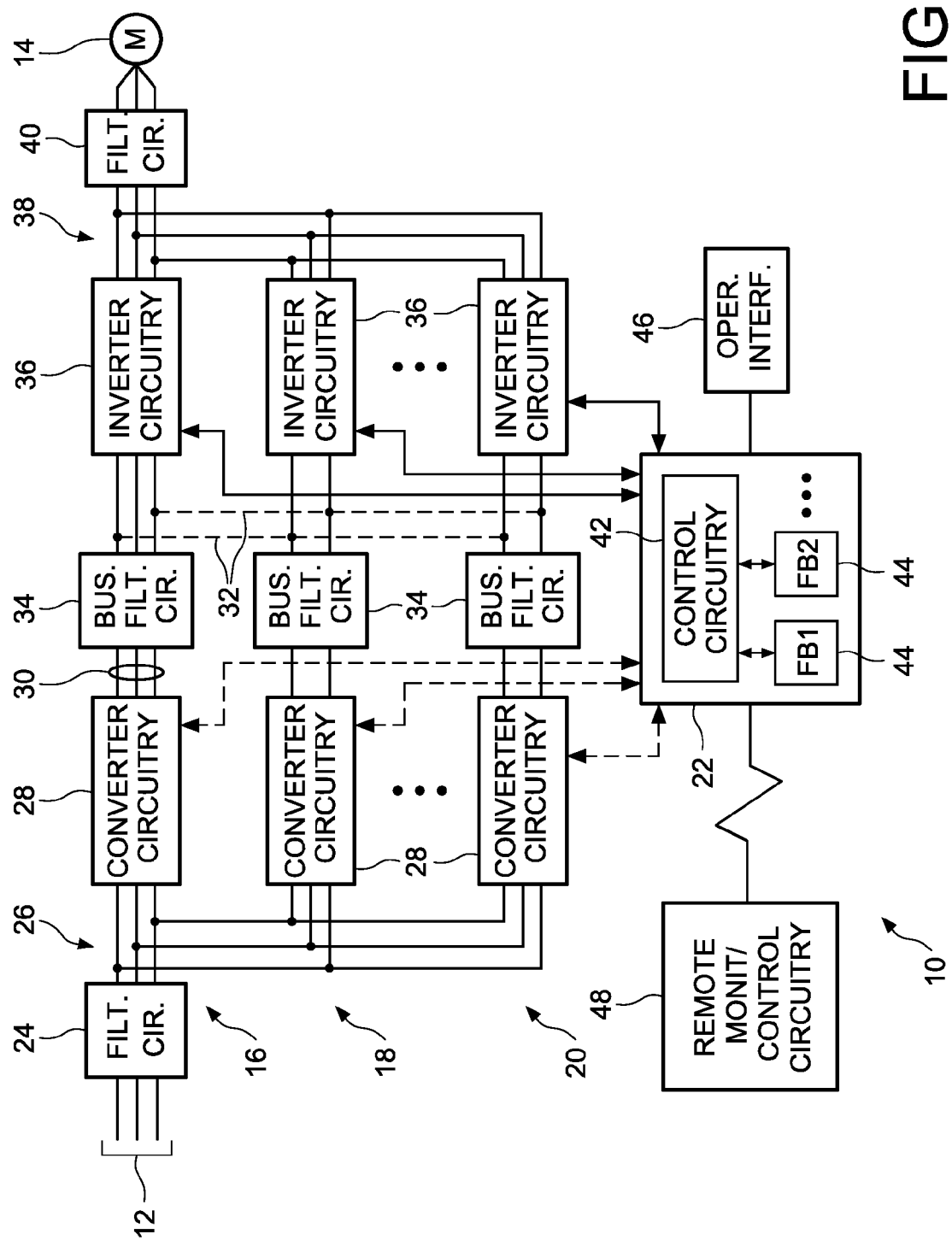
FIG. 1 is a diagrammatical representation of an exemplary embodiment of a motor drive system.

Turning now to the drawings, FIG. 1 represents a drive system 10 in accordance with aspects of the present disclosure. The drive system 10 is configured to be coupled to a source of AC power, such as the power grid, as indicated by reference numeral 12, and to deliver conditioned power to a motor 14 or any other suitable load. The system 10 comprises a plurality of individual drives coupled to one another in parallel to provide power to the load. In the example illustrated in FIG. 1, for example, a first drive 16 is illustrated as coupled to a second drive 18 and a further drive 20 which may be the third, fourth, fifth, or any suitable terminally numbered drive. A presently contemplated embodiment may accommodate up to five parallel drives, although fewer or more may be configured in the same way. It should be noted that certain aspects of the techniques described herein may be used with a single drive. However, other aspects are particularly well-suited for multiple parallel drives.

A controller 22 is coupled to the circuitry of each drive and is configured to control operation of the circuitry as described more fully below. In a presently contemplated embodiment, the controller 22 may be housed in one of the drives or in a separate enclosure. Appropriate cabling (e.g., fiber optic cabling) is provided to communicate control and feedback signals between the controller 22 and the circuitry of the individual drives. The controller 22 will coordinate operation of the drives to ensure that the provision of power is shared and that operation of the drives is synchronized sufficiently to provide the desired power output to the motor 14. In the embodiment illustrated in FIG. 1, power filtration circuitry 24 may be provided upstream of the motor drives. Such circuitry may be provided upstream of a line-side bus 26 or similar circuitry may be provided downstream of the bus in each of the drives. Such circuitry may include inductors, capacitors, circuit breakers, fuses, and so forth, that are generally conventional in design and application.

The power bus 26 distributes three phases of AC power between the individual drives. Downstream of this bus, each drive includes converter circuitry 28 that converts the three phases of AC power to DC power that is applied to a DC bus 30. The converter circuitry 28 may be passive or active. That is, in a presently contemplated embodiment, non-switched circuitry alone is used to define a full wave rectifier that converts the incoming AC power to DC power that is applied to the bus. In other embodiments, the converter circuitry 28 may be active, including controlled power electronic switches that are switched between conducting and non-conducting states to control the characteristics of the DC power applied to the bus.

Continuing with the components of each drive, bus filtration circuitry 34 may be provided that conditions the DC power conveyed along the DC busses 30. Such filtration circuitry may include, for example, capacitors, inductors (e.g., chokes), braking resistors, and so forth. In some embodiments, common devices may be provided on the DC busses, which may be coupled to one another by links illustrated by reference numeral 32.

Each drive further includes inverter circuitry 36. As will be appreciated by those skilled in the art, such circuitry will typically include sets of power electronic switches, such as insulated gate bipolar transistors (IGBTs) and diodes arranged to allow for converting the DC power from the bus to controlled frequency AC output waveforms. The inverters thus create three phases of controlled frequency output, with each phase being shorted or combined along an output bus 38. The combined power may be applied to output filtration circuitry 40, which may include magnetic components that couple the output power between the phases. Such circuitry may also be provided along the load-side bus 38.

The controller 22 will typically include control circuitry 42 that is configured to implement various control regimes by properly signaling the inverter circuitry 36 (and, where appropriate, the converter circuitry 28) to control the power electronic switches within these circuits. The control circuitry 42 may, for example, include any suitable processor, such as a microprocessor, field programmable gate array (FPGA), memory circuitry, supporting power supplies, and so forth. In motor drive applications, the control circuitry 42 may be configured to implement various desired control regimes, such as for speed regulation, torque control, vector control, start-up regimes, and so forth. In the embodiment illustrated in FIG. 1, various functional circuit boards 44 are linked to the control circuitry 42 and may be provided for specific functions. For example, a wide range of options may be implemented by the use of such circuitry, including the control regimes mentioned above, as well as various communications options, safety options, and so forth.

The controller 22 will typically allow for connection to an operator interface, which may be local at the controller and/or remote from it. In a presently contemplated embodiment, for example, an operator interface 46 may be physically positioned on the controller 22 but removable for hand-held interfacing. The interface circuitry (e.g., portable computers) may also be coupled permanently or occasionally to the controller 22, such as via Internet cabling, or other network protocols, including standard industrial control protocols. Finally, the controller 22 may be coupled to various remote monitoring and control circuitry as indicated by reference numeral 48. Such circuitry may include monitoring stations, control stations, control rooms, remote programming stations, and so forth. It should be noted that such circuitry may also include other drives, such that the operation of the system 10 may be coordinated, where desired, with that of other equipment. Such coordination is particularly useful in automation settings where a large number of operations are performed in a coordinated manner. Thus, the control circuitry 42 may form its control in coordination with logic implemented by automation controllers, separate computers, and so forth.

Figure 2:
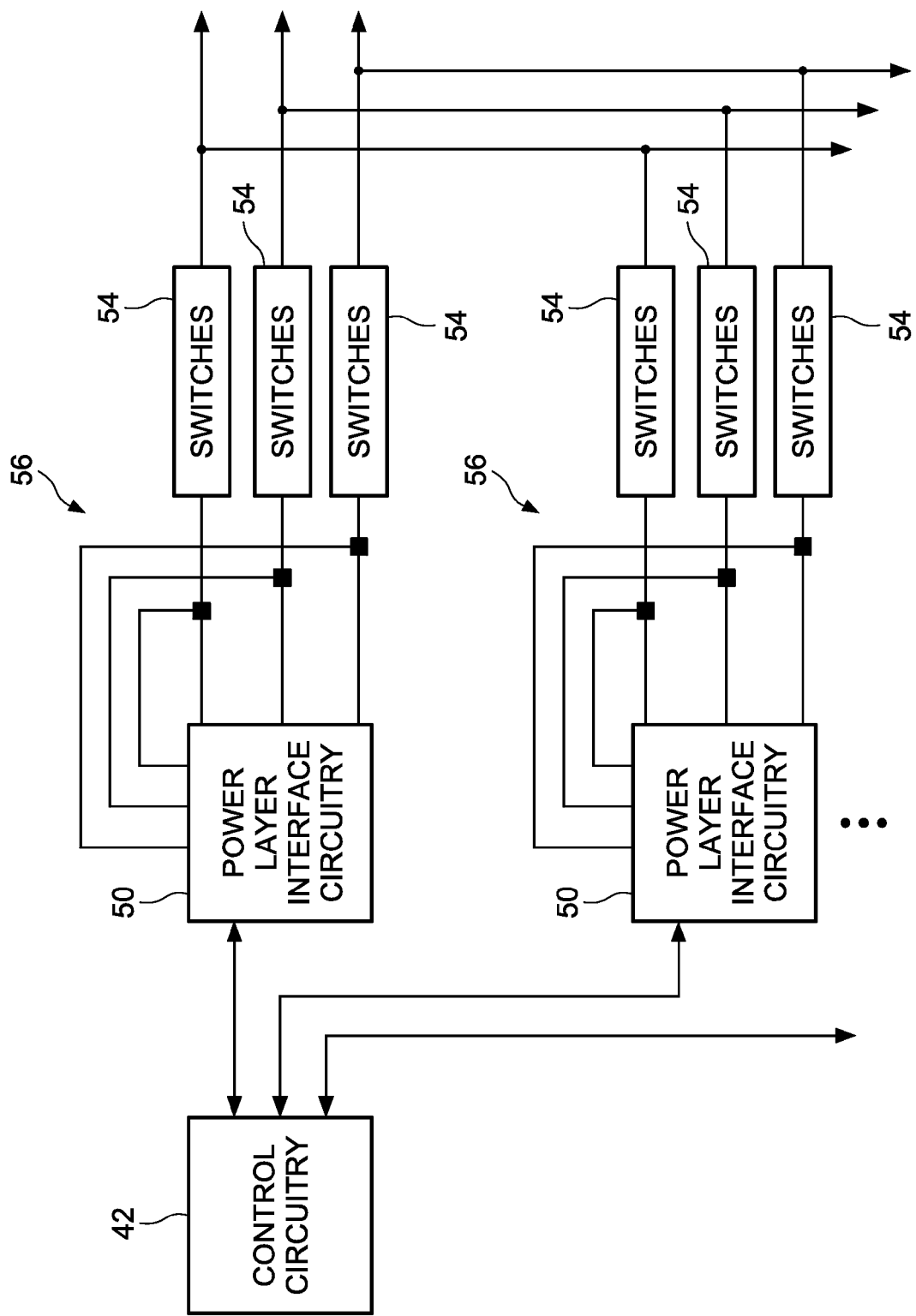
FIG. 2 is further diagrammatical representation of a portion of the motor drive system of FIG. 1 illustrating power layer interface circuitry used in the multiple parallel motor drives.

FIG. 2 illustrates certain of the components that may be included within the individual drives described above. For example, the control circuitry 42 is illustrated as being coupled to power layer interface circuitry 50. Such circuitry will be provided in each drive and will operate independently within the drive, but in a coordinated manner under the control of the control circuitry. The power layer interface circuitry may include a range of circuits, such as a dedicated processor, memory, and so forth. In a presently contemplated embodiment, the power layer interface circuitry 50 includes an FPGA that implements programming for carrying out control of the power electronic switches within the individual drive. The power layer interface circuitry thus communicates with the power layer as indicated by reference numeral 52, which is itself comprised of sets of power electronic devices, such as IGBTs and diodes. These switches are illustrated generally by reference numeral 54. In a typical arrangement, the switches may be provided on a single support or on multiple supports. For example, in a presently contemplated embodiment separate supports are provided for each phase of power, with multiple IGBTs and diodes being provided on each support. These devices themselves may be constructed in any suitable manner, such as direct bond copper stacks, lead frame packages, and so forth. In general, one or several types of feedback will be provided in the circuitry as indicated by reference numeral 56. Such feedback may include, for example, output voltages, output currents, temperatures, and so forth. Other feedback signals may be provided throughout the system, such as to allow the control circuitry to monitor the electrical parameters of the incoming power, the outgoing power, the DC bus power, and so forth.

Figure 3:
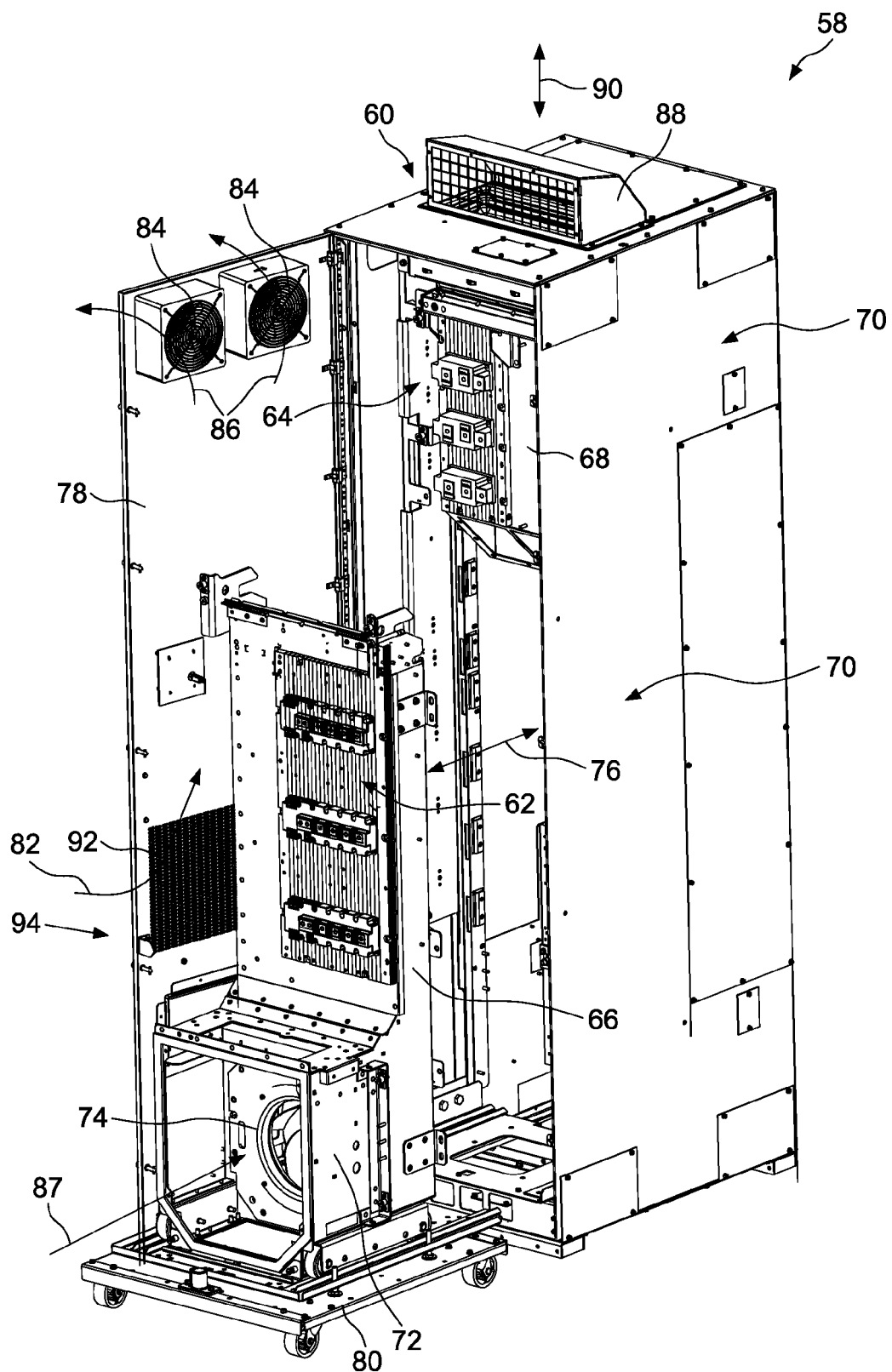
FIG. 3 is a perspective view of an exemplary embodiment of a cabinet, within which components of a motor drive may be housed.

FIG. 3 is a perspective view of an exemplary embodiment of a cabinet 58, within which components of a motor drive 60 are housed. As illustrated, the cabinet 58 includes an inverter 62 (e.g., including the inverter circuitry 36 of FIG. 1) and a converter 64 (e.g., including the converter circuitry 28 of FIG. 1), among other components. The inverter 62 is at least partially attached to an inverter duct 66, and the converter 64 is at least partially attached to a converter duct 68. More specifically, the inverter 62 is sealingly attached to the inverter duct 66 such that the inverter duct 66 supports the inverter 62 when the inverter duct 66 is removed from the cabinet 58, and the converter 64 is sealingly attached to the converter duct 68 such that the converter duct 68 supports the converter 64 when the converter duct 68 is removed from the cabinet 58. In addition, heat sink components of the inverter 62 and converter 64 may be disposed within the inverter duct 66 and the converter duct 68, respectively. In the illustrated embodiment, the inverter 62 and related components (e.g., the inverter duct 66) have been rolled out of the cabinet 58 and are separated from the converter 64 and related components (e.g., the converter duct 68).

When coupled together, the inverter duct 66 and the converter duct 68 form a duct system 70 or a portion of the duct system 70 for the motor drive 60. In addition, the inverter duct 66 is attached to an inlet air duct 72, within which a blower 74 is housed. The inlet air duct 72 may also be considered a component of the duct system 70. Indeed, in certain embodiments, the inverter duct 66 and the inlet air duct 72 may be integrated into a single unit. However, in other embodiments, the inverter duct 66 and the inlet air duct 72 may be separate. As described in greater detail below, the inverter duct 66, the converter duct 68, and an exhaust duct (not shown) may define a pair of parallel air flow channels of the duct system 70, through which cooling air blown by the blower 74 may flow. As also described in greater detail below, the inverter duct 66, the converter duct 68, and the exhaust duct include angled interfaces that mate during assembly of the inverter duct 66, the converter duct 68, and the exhaust duct to form the duct system 70. The cooling air flowing through the parallel air flow channel paths is used to dissipate heat from the heat sinks associated with the inverter 62 and the converter 64.

As illustrated by arrow 76 in FIG. 3, the inlet air duct 72 and the inverter duct 66 may be rolled into and out of the cabinet 58 when a cabinet door 78 is opened. In particular, in certain embodiments, the inlet air duct 72 and the inverter duct 66 are integral with or positioned on a transport device. In the illustrated embodiment, the inlet air duct 72 and the inverter duct 66 are placed on an auxiliary cart or platform 80 facilitate movement of the inlet air duct 72 and inverter duct 66 relative to the converter duct 68 and other aspects of the cabinet 58 such that field wiring of the motor drive 60 may be accessed. The auxiliary cart or platform 80 illustrated in FIG. 3 is but one exemplary embodiment, and other types of auxiliary carts or platforms 80 may be used to facilitate movement of the inlet air duct 72 and inverter duct 66 relative to the converter duct 68 and other aspects of the cabinet 58.

When considered together, the inverter 62, the inverter duct 66, the inlet air duct 72 (i.e., the inlet/inverter duct assembly 94), and associated components are generally the heaviest portion of the motor drive 60. Accordingly, the ability of present embodiments to roll the inlet/inverter duct assembly 94 into and out of the cabinet 58 facilitates maintenance of the motor drive 60 relative to traditional systems. In addition, in certain embodiments, the converter 64 and associated converter duct 68 may be removed through the top of the cabinet 58 once an exhaust vent 88 is removed, as illustrated by arrow 90. Indeed, some embodiments may include an integral hook or eyelet on the converter duct 68 for this purpose. Locating the converter 64 and converter duct 68 in the top portion of the cabinet 58 further facilitates maintenance of the motor drive 60 because the converter 64 and associated converter duct 68 are generally not as heavy as the combined weight of the inlet/inverter duct assembly 94. In particular, the embodiments described herein increase the modularity of the motor drive 60 without including complicated joints and avoiding the need to disturb field wiring. For example, the inverter 62 and inverter duct 66 may be removed without the need to remove the rest of the motor drive 60 when the inverter 62 requires servicing. In particular, the inverter duct 66 may be capable of supporting the inverter 62 when the inverter duct 66 is removed from the cabinet 58 without removal of the inverter 62 from the inverter duct 66. Similarly, the converter duct 68 may be capable of supporting the converter 64 when the converter duct 68 is removed from the cabinet 58 without removal of the converter 64 from the converter duct 68. Moreover, the inverter duct 66 and the converter duct 68 may be capable of supporting the inverter 62 and the converter 64 when the inverter duct 66 and the converter duct 68 are removed from the cabinet 58 together without removal of the inverter 62 from the inverter duct 66 and without removal of the converter 64 from the converter duct 68.

When the system components are assembled, the cabinet door 78 is closed, and the motor drive 60 is in operation, air is drawn into the cabinet 58 through vents 92 in the cabinet door 78, as illustrated by arrow 82. The air drawn in through the vents 92 is then expelled through fans 84 in the cabinet door 78 to discard waste heat in the cabinet 58, as illustrated by arrows 86. In addition, air 87 is also drawn into the cabinet 58 and into the inlet air duct 72, where it is blown by the blower 74 through parallel ducts channels of the inverter duct 66. The air blown through the parallel duct channels of the inverter duct 66 is then directed through the mated parallel duct channels of the converter duct 68. Then, the air directed through the parallel duct channels of the converter duct 68 is directed through mated parallel duct channels of an exhaust duct and out of the top of the cabinet 58 through the exhaust vent 88. This air flow through the various duct segments passes over heat sinks associated with the inverter 62 and the converter 64 and provides cooling for these components.

Figure 4:
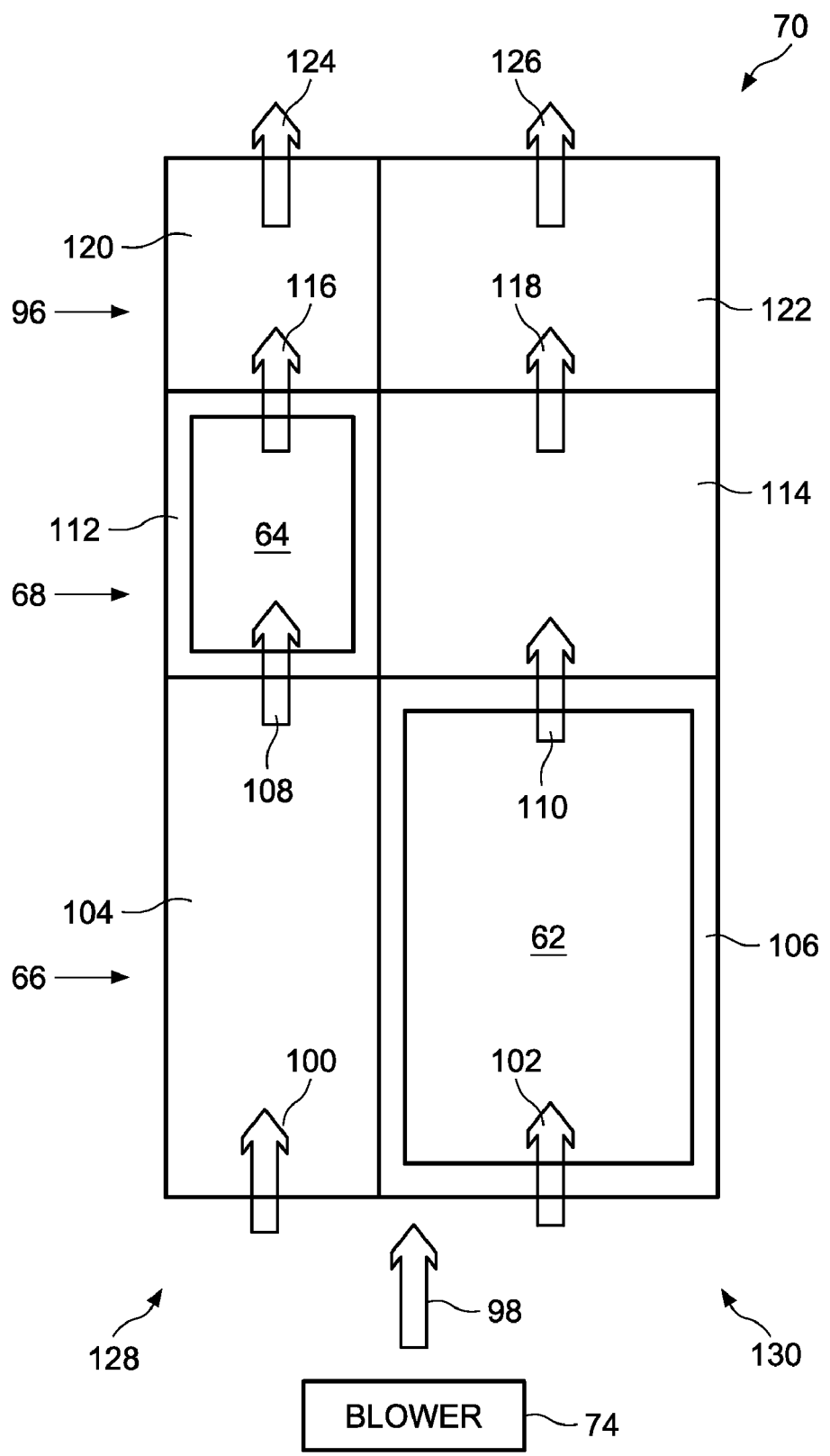
FIG. 4 is a schematic diagram of an exemplary embodiment of a motor drive duct system, which includes an inverter duct, a converter duct, and an exhaust duct.

For example, FIG. 4 is a schematic diagram illustrating cooling air flow paths through an exemplary embodiment of the duct system 70, which includes the inverter duct 66, the converter duct 68, and an exhaust duct 96. As illustrated, the inverter duct 66 is attached to at least a portion of the inverter 62, the converter duct 68 is attached to at least a portion of the converter 64, and the exhaust duct 96 is attached to no functional components of the motor drive 60. Inlet air flow 98 to the duct system 70 is generated by the blower 74 and is initially split into a first air flow 100 and a second air flow 102 by separate channels of the inverter duct 66. However, in other embodiments, the inlet air flow 98 may be split into separate flow paths prior to entering the inverter duct 66 (e.g., by a baffle or channels in the inlet air duct 72). The first and second air flows 100, 102 proceed through corresponding channels of segments of the duct system 70 and encounter different system components (e.g., heat sinks of the inverter 62 and the converter 64), which cause different temperature changes in the air. Indeed, air coming into and out of a particular channel of a duct segment will have different characteristics. Similarly, air exiting or entering a first channel of a duct segment will have characteristics that are different from air exiting or entering a second channel of the same duct segment. Thus, while the air of each air flow 100, 102 remains the same, different portions of the air flow will have different temperatures, pressures, and velocities, and will be indicated by arrows with different reference numbers based on location in the duct system 70 to facilitate discussion.

As illustrated in FIG. 4, the first air flow 100 is blown into a first inverter duct channel 104 of the inverter duct 66, and the second air flow 102 is blown into a second inverter duct channel 106 of the inverter duct 66. The second air flow 102 is used to dissipate heat generated by the inverter 62 through an inverter heat sink. Indeed, the second air flow 102 enters the second inverter duct channel 106, pulls heat away from the heat sink as it passes over the inverter 62, and exits the second inverter duct channel 106. This generally causes an increase in the temperature of the air flow 102 and a reduction in the speed of the air flow due to interaction with heat sink fins and so forth. In contrast, the first air flow 100 generally flows unimpeded through the first inverter duct channel 104. Indeed, the first inverter duct channel 104 is substantially vacant and, thus, does not substantially obstruct the first air flow 100. In general, the first inverter duct channel 104 and the second inverter duct channel 106 are adjacent to and parallel with each other and are partially defined by front and back walls of the inverter duct 66 and an interior partition wall, as described below. In other words, the first inverter duct channel 104 and the second inverter duct channel 106 may share common front and back walls and the interior partition wall. However, in certain embodiments, the front wall locations of the first and/or second inverter duct channels 104, 106 may be used to tune the air flow balance between the first and second inverter duct channels 104, 106.

Upon exiting the corresponding channels of the inverter duct 66, the first air flow 100 may be referred to as first air flow 108 and the second air flow 102 may be referred to as second air flow 110, as indicated by the corresponding arrows in FIG. 4. The first air flow 108 exiting the first inverter duct 104 is directed into a first converter duct channel 112 of the converter duct 68, and the second air flow 110 exiting the second inverter duct channel 106 is directed into a second converter duct channel 114 of the converter duct 68. Because the second air flow 110 exiting the second inverter duct channel 106 was used to carry away heat from the heat sink associated with the inverter 62, the temperature of the second air flow 110 entering the second converter duct channel 114 will generally be higher than the temperature of the first air flow 108 entering the first converter duct channel 112. The first air flow 108 in the first converter duct channel 112 is used to dissipate heat generated by the converter 64 through a converter heat sink. Indeed, the first air flow 108 enters the first converter duct channel 112, pulls heat away from the heat sink as it passes over the converter 64, and exits the first converter duct channel 112. This generally causes an increase in the temperature of the first air flow 108 and a reduction in the speed of the air flow due to interaction with heat sink fins and so forth. In contrast, the second air flow 110 generally flows unimpeded through the second converter duct channel 114. Indeed, the second converter duct channel 114 is substantially vacant and, thus, does not substantially obstruct the second air flow 110. In general, the first converter duct channel 112 and the second converter duct channel 114 are adjacent to and parallel with each other and are partially defined by front and back walls of the converter duct 68 and an interior partition wall, as described below. In other words, the first converter duct channel 112 and the second converter duct channel 114 share common front and back walls and the interior partition wall. However, in certain embodiments, the front wall locations of the first and/or second converter duct channels 112, 114 may be used to tune the air flow balance between the first and second converter duct channels 112, 114.

Upon exiting the corresponding channels of the converter duct 68, the first air flow 108 may be referred to as first air flow 116 and the second air flow 110 may be referred to as second air flow 118, as indicated by the corresponding arrows in FIG. 4. The first air flow 116 exiting the first converter duct channel 112 is directed into a first exhaust duct channel 120 of the exhaust duct 96, and the second air flow 118 exiting the second converter duct channel 114 is directed into a second exhaust duct channel 122 of the exhaust duct 96. Because the first air flow 116 exiting the first converter duct channel 112 was used to carry away heat from the heat sink associated with the converter 64, the temperature of the first air flow 116 exiting the first converter duct channel 112 will generally be higher than the temperature of the first air flow 108 entering the first converter duct channel 112. The first and second air flows 116, 118 entering the first and second exhaust duct channels 120, 122 generally flow unimpeded through the first and second exhaust duct channels 120, 122, respectively, and exit as first and second exhaust air flows 124, 126 through the exhaust vent 88 in the top of the cabinet 58 of FIG. 3. In other words, both the first and second exhaust duct channels 120, 122 are substantially vacant. In general, the first exhaust duct channel 120 and the second exhaust duct channel 122 are adjacent to and parallel with each other and are partially defined by front and back walls of the exhaust duct 96 and a common interior partition wall. In addition, in certain embodiments, the exhaust duct 96 may only include one common duct path, into which the first and second air flows 116, 118 may flow before exiting the exhaust duct 96.

The first inverter duct channel 104, first converter duct channel 112, and first exhaust duct channel 120 form a first duct channel path 128. Similarly, the second inverter duct channel 106, second converter duct channel 114, and second exhaust duct channel 122 form a second duct channel path 130. In general, the first air flow 100, 108, 116, 124 through the first duct channel path 128 is used to dissipate and carry away heat generated by the converter 64, whereas the second air flow 102, 110, 118, 126 through the second duct channel path 130 is used to dissipate and carry away heat generated by the inverter 62. The first and second duct channel paths 128, 130 form parallel air cooling paths through which the cooling air may be routed. In particular, the first duct channel path 128 is dedicated to providing cooling air for the heat sink associated with the converter 64, and the second duct channel path 130 is dedicated to providing cooling air for the heat sink associated with the inverter 62. As such, the parallel duct channel paths 128, 130 eliminate preheating of the cooling air to downstream heat sinks, as would occur if the duct channel paths 128, 130 were in series, because each duct channel path 128, 130 receives ambient air. That is, essentially ambient air is passed over the respective heat sinks in each duct channel path 128, 130 in accordance with the present embodiments because the duct channel paths 128, 130 are in parallel instead of in series.

In certain embodiments, the second duct channel path 130 may have a substantially greater cross-sectional volume than the first duct channel path 128, enabling higher cooling air flow rates across the heat sink associated with the inverter 62 than across the heat sink associated with the converter 64. In other words, the volumes of the parallel duct channel paths 128, 130 are dimensioned to pass cooling air at volumes or rates configured to optimize the cooling of the inverter 62 and the converter 64. This is due at least in part to the fact that the inverter 62 typically generates more heat than the converter 64. The parallel duct channel paths 128, 130 allow for balancing of air flow through each duct channel path 128, 130 inasmuch as the parallel duct channel paths 128, 130 may be resized based on predicted heat generation of the inverter 62 and the converter 64. The parallel duct channel paths 128, 130 also eliminate the need for individual blowers for each power section, thereby reducing the size of the duct system 70 and the cabinet 58 of FIG. 3. In certain embodiments, an inverter 62 may be used without a converter 64 for common bus or parallel drive applications. In these embodiments, the first duct channel path 128 may be blocked off at the interface between the inverter duct 66 and the converter duct 68, and an alternate duct section may be substituted for the converter duct 68.

As described above with respect to FIG. 3, the inverter duct 66 may be rolled into and out of the cabinet 58 such that it is separated from the converter duct 68, as illustrated by arrow 76 in FIG. 3. When the inverter duct 66 and the converter duct 68 are assembled together, mating angled surfaces of the inverter duct 66 and the converter duct 68 abut each other, connecting the first inverter duct channel 104 with the first converter duct channel 112, and connecting the second inverter duct channel 106 with the second converter duct channel 114.

Figure 5:
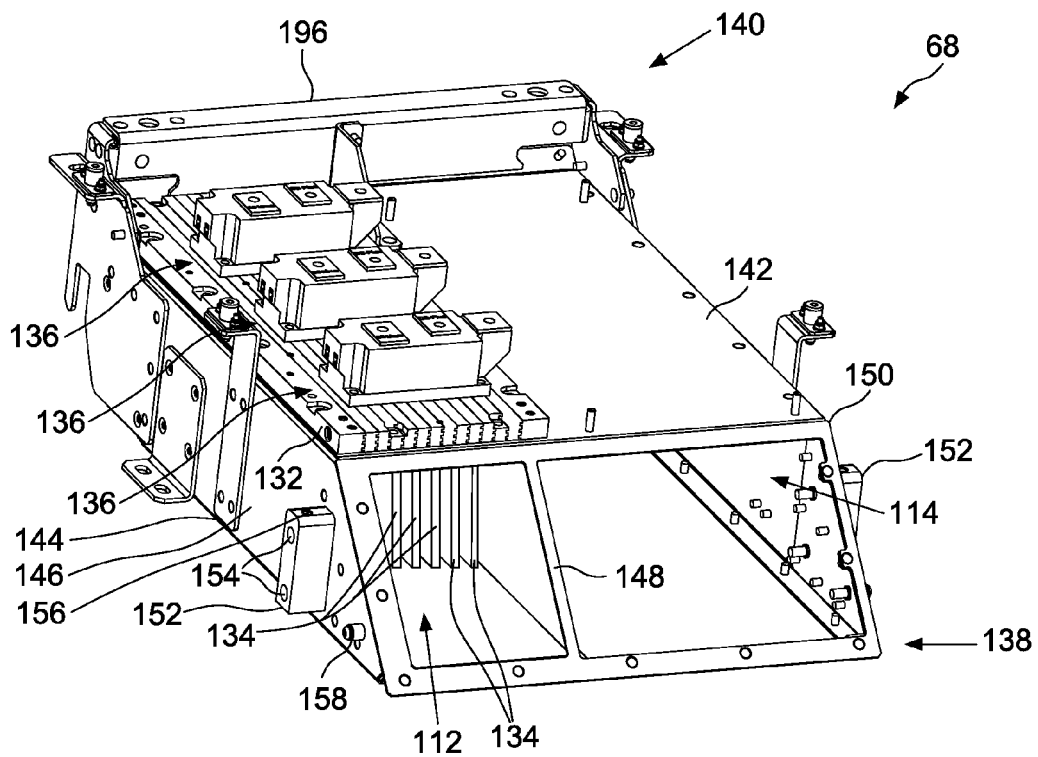
FIG. 5 is a perspective view of an exemplary embodiment of the converter duct when extracted from the cabinet of FIG. 3.

FIG. 5 is a perspective view of an exemplary embodiment of the converter duct 68 extracted from the cabinet 58 of FIG. 3. As illustrated, a converter heat sink 132 having a plurality of heat sink fins 134 extending into the first converter duct channel 112 is attached to the converter duct 68. In addition, components 136 of the converter 64 are attached to the converter heat sink 132 on a side of the converter heat sink 132 opposite the plurality of heat sink fins 134 such that the components 136 are external to the first converter duct channel 112. As described above, cooling air flowing through the first converter duct channel 112 dissipates and carries away heat generated by the components 136 of the converter 64. In particular, heat generated by the components 136 of the converter 64 flows through the converter heat sink 132 and associated heat sink fins 134 into the first converter duct channel 112. The heat is then transferred from the heat sink fins 134 to cooling air flowing from an upstream end 138 of the converter duct 68 and carried to a downstream end 140 of the converter duct 68 through the first converter duct channel 112.

As illustrated, the converter duct 68 includes an angled upstream end 138 that mates with a downstream end of the inverter duct 66 as described below. In particular, in certain embodiments, the upstream end 138 of the converter duct 68 extends out from a front wall 142 of the converter duct 68 to a back wall 144 of the converter duct 68 at an oblique angle (i.e., not a right angle). More specifically, the upstream end 138 of the converter duct 68 is at an obtuse angle (e.g., greater than 90° angle) with respect to the front wall 142 of the converter duct 68, and is at an acute angle (e.g., less than 90° angle) with respect to the back wall 144 of the converter duct 68. For example, in certain embodiments, the angle of the upstream end 138 with respect to the front wall 142 of the converter duct 68 is approximately 135° (see, e.g., angle θ illustrated in FIG. 8), whereas the angle of the upstream end 138 with respect to the back wall 144 of the converter duct 68 is approximately 45° (see, e.g., angle φ illustrated in FIG. 8). The 45° and 135° angles optimize the sealing of both the front wall 142 and the back wall 144 with the upstream end 138 of the converter duct 68.

The first converter duct channel 112 of the converter duct 68 is defined between the front and back walls 142, 144 of the converter duct 68, a left wall 146 of the converter duct 68, and an interior partition wall 148 extending from the front wall 142 to the back wall 144 within the converter duct 68. The second converter duct channel 114 of the converter duct 68 is defined between the front and back walls 142, 144 of the converter duct 68, a right wall 150 of the converter duct 68, and the interior partition wall 148 extending from the front wall 142 to the back wall 144 within the converter duct 68.

The converter duct 68 includes generally rectangular-shaped or obround keys 152 attached to both the left and right walls 146, 150 of the converter duct 68. In particular, in certain embodiments, the keys 152 are attached to the left and right walls 146, 150 of the converter duct 68 via two or more fasteners 154. As described in greater detail below, the keys 152 are configured to mate with brackets attached to the inverter duct 66 to align the converter duct 68 with the inverter duct 66 when the converter duct 68 and the inverter duct 66 are assembled together. In addition, the keys 152 include keyholes 156 extending at least partially through the keys 152 from front to back. As also described in greater detail below, the keyholes 156 are configured to mate with pins that help secure the converter duct 68 to the inverter duct 66 when the converter duct 68 and the inverter duct 66 are assembled together. The converter duct 68 also includes at least one additional alignment feature 158 extending from the left and right walls 146, 150 of the converter duct 68. The alignment features 158 are also configured to mate with the brackets attached to the inverter duct 66 to align the converter duct 68 with the inverter duct 66 when the converter duct 68 and the inverter duct 66 are assembled together. In addition, in certain embodiments, the alignment features 158 may act as additional keys.

Figure 6:
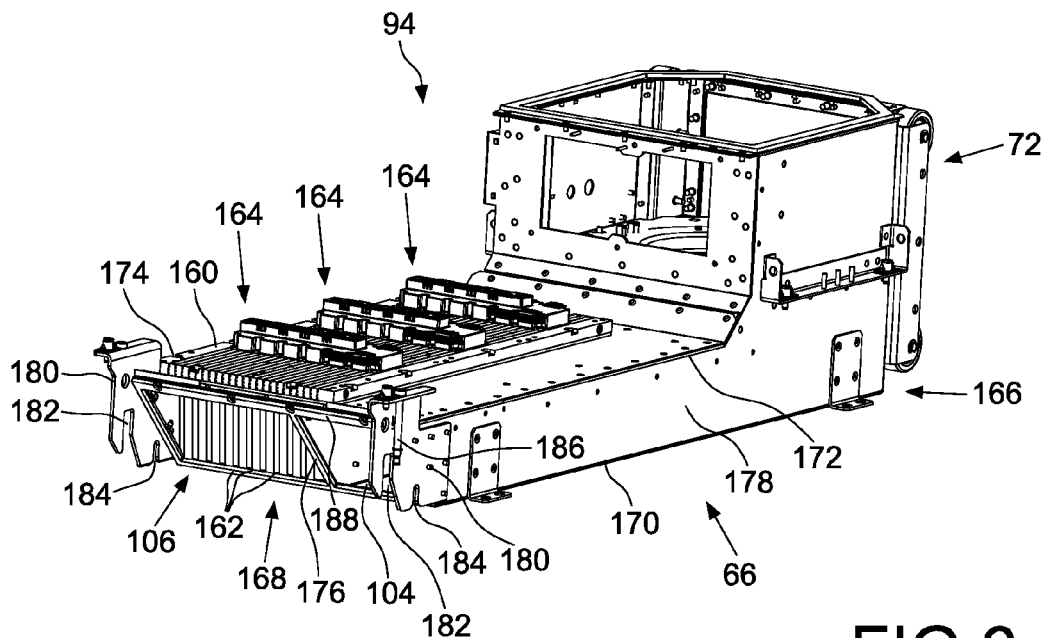
FIG. 6 is a perspective view of an exemplary embodiment of the inverter duct when extracted from the cabinet of FIG. 3.

FIG. 6 is a perspective view of an exemplary embodiment of the inverter duct 66 extracted from the cabinet 58 of FIG. 3. As illustrated, an inverter heat sink 160 having a plurality of heat sink fins 162 extending into the second inverter duct channel 106 is attached to the inverter duct 66. In addition, components 164 of the inverter 62 are attached to the inverter heat sink 160 on a side of the inverter heat sink 160 opposite the plurality of heat sink fins 162 such that the components 164 are external to the second inverter duct channel 106. As described above, cooling air flowing through the second inverter duct channel 106 dissipates and carries away heat generated by the components 164 of the inverter 62. In particular, heat generated by the components 164 of the inverter 62 flow through the inverter heat sink 160 and associated heat sink fins 162 into the second inverter duct channel 106. The heat is then transferred from the heat sink fins 162 to cooling air flowing from an upstream end 166 of the inverter duct 66 and carried to a downstream end 168 of the inverter duct 66 through the second inverter duct channel 106.

As illustrated, the inverter duct 66 includes an angled downstream end 168 that mates with the angled upstream end 138 of the converter duct 68 described above. In particular, in certain embodiments, the downstream end 168 of the inverter duct 66 extends out from a back wall 170 of the inverter duct 66 to a front wall 172 of the inverter duct 66 at an oblique angle (i.e., not a right angle). More specifically, the downstream end 168 of the inverter duct 66 is at an obtuse angle (e.g., greater than 90° angle) with respect to the back wall 170 of the inverter duct 66, and is at an acute angle (e.g., less than 90° angle) with respect to the front wall 172 of the inverter duct 66. For example, in certain embodiments, the angle of the downstream end 168 with respect to the back wall 170 of the inverter duct 66 is approximately 135°, whereas the angle of the downstream end 168 with respect to the front wall 172 of the inverter duct 66 is approximately 45°. The 45° and 135° angles (or, indeed, any suitable supplementary angles) optimize the sealing of both the back wall 170 and the front wall 172 with the downstream end 168 of the inverter duct 66.

The second inverter duct channel 106 of the inverter duct 66 is defined between the front and back walls 172, 170 of the inverter duct 66, a right wall 174 of the inverter duct 66, and an interior partition wall 176 extending from the front wall 172 to the back wall 170 within the inverter duct 66. The first inverter duct channel 104 of the inverter duct 66 is defined between the front and back walls 172, 170 of the inverter duct 66, a left wall 178 of the inverter duct 66, and the interior partition wall 176 extending from the front wall 172 to the back wall 170 within the inverter duct 66.

The inverter duct 66 includes brackets 180 attached to both the right and left walls 174, 178 of the inverter duct 66. The brackets 180 constrain motion in orthogonal directions to ensure proper duct alignment and seal compression. In particular, the brackets 180 are configured to draw the inverter duct 66 and the converter duct 68 into sealed engagement via a set of fasteners. The brackets 180 are integrated structural components of the duct system 70 and provide a path for load transfer during lifting or raising from horizontal to vertical orientations. In addition, the brackets 180 also include lifting holes to lift the inverter duct 66 when the inverter duct 66 is decoupled from the converter duct 68. Besides joining the inverter and converter ducts 66, 68 together, the brackets 180 also provide a means to secure the motor drive to the cabinet 58 of FIG. 3, as well as providing a path for load transfer when lifting the entire motor drive.

As described in greater detail below, the brackets 180 are configured to mate with the keys 152 and alignment features 158 of the converter duct 68 described above with respect to FIG. 5. In particular, the brackets 180 include generally open-ended rectangular-shaped or obround slots 182 configured to mate with the generally rectangular-shaped keys 152 of the converter duct 68 to align the inverter duct 66 with the converter duct 68 when the inverter duct 66 and the converter duct 68 are assembled together. In addition, the brackets 180 include at least one alignment slot 184 configured to mate with the alignment features 158 of the converter duct 68 to align the inverter duct 66 with the converter duct 68 when the inverter duct 66 and the converter duct 68 are assembled together.

Each of the brackets 180 may be associated with a respective pin 186. In particular, the pins 186 may be configured to mate with the keyholes 156 extending at least partially through the keys 152 of the converter duct 68. When the inverter duct 66 and the converter duct 68 are assembled together, the pins 186 may be attached to the keys 152 of the converter duct 68, thereby securing the inverter duct 66 to the converter duct 68. Any suitable attachment features may be used for the keyholes 156 of the keys 152 of the converter duct 68 and the pins 186 of the brackets 180 of the inverter duct 66. For example, in certain embodiments, the keyholes 156 and the pins 186 may be threaded such that the pins 186 are screwed into the keyholes 156. It should be noted that, in certain embodiments, the inverter duct 66 may include the keys and alignment features, and the converter duct 68 may include the brackets, slots, and pins. In other words, the attachment features of the inverter duct 66 and the converter duct 68 may be reversed from the embodiments illustrated in FIGS. 5 and 6.

In addition, in certain embodiments, a gasket-like seal 188 may be attached to the downstream end 168 of the inverter duct 66 such that the seal 188 is compressed between and separates the inverter duct 66 from the converter duct 68 when the inverter duct 66 and the converter duct 68 are assembled together. The seal 188 provides sealing capabilities that maintain the air flow through the first and second duct channel paths 128, 130 described above with respect to FIG. 4 with little to no leakage. In addition, the seal 188 prevents ingress of debris into the cabinet 58 of FIG. 3 from the first and second duct channel paths 128, 130, thereby protecting sensitive components in the cabinet 58. In particular, the seal 188 forms a NEMA 12/IP54 seal without the use of adhesive sealants, while also eliminating the need for restrictive intake filters. The seal 188 also includes gasket stops to prevent over compression and to transfer some of the loads between the inverter duct 66 and the converter duct 68. In particular, in certain embodiments, the seal 188 is comprised of a generally compressible material, such as foam or the like.

Figure 7:
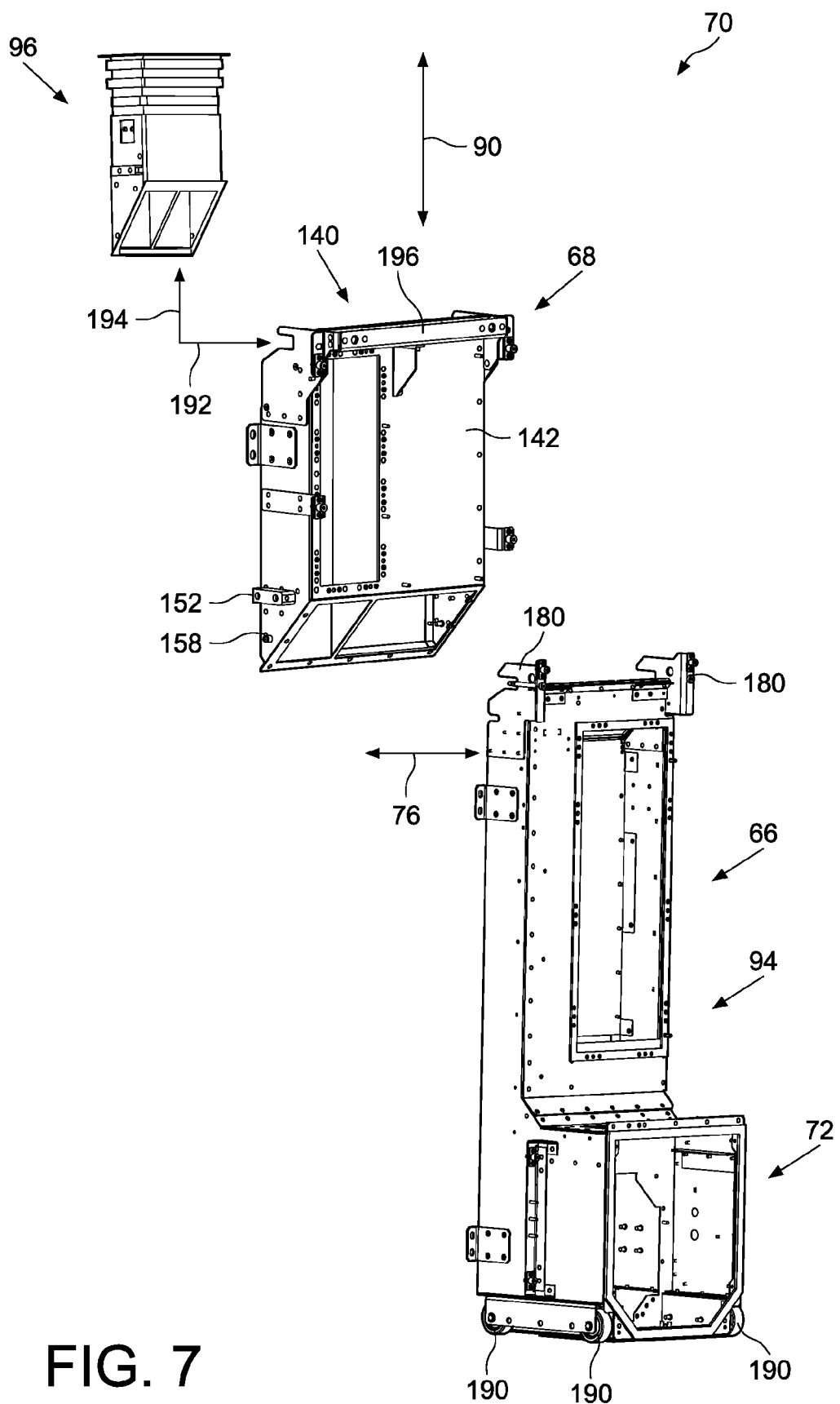
FIG. 7 is a perspective exploded view of an exemplary embodiment of the inverter duct, converter duct, inlet duct, and exhaust duct.
Figure 8:
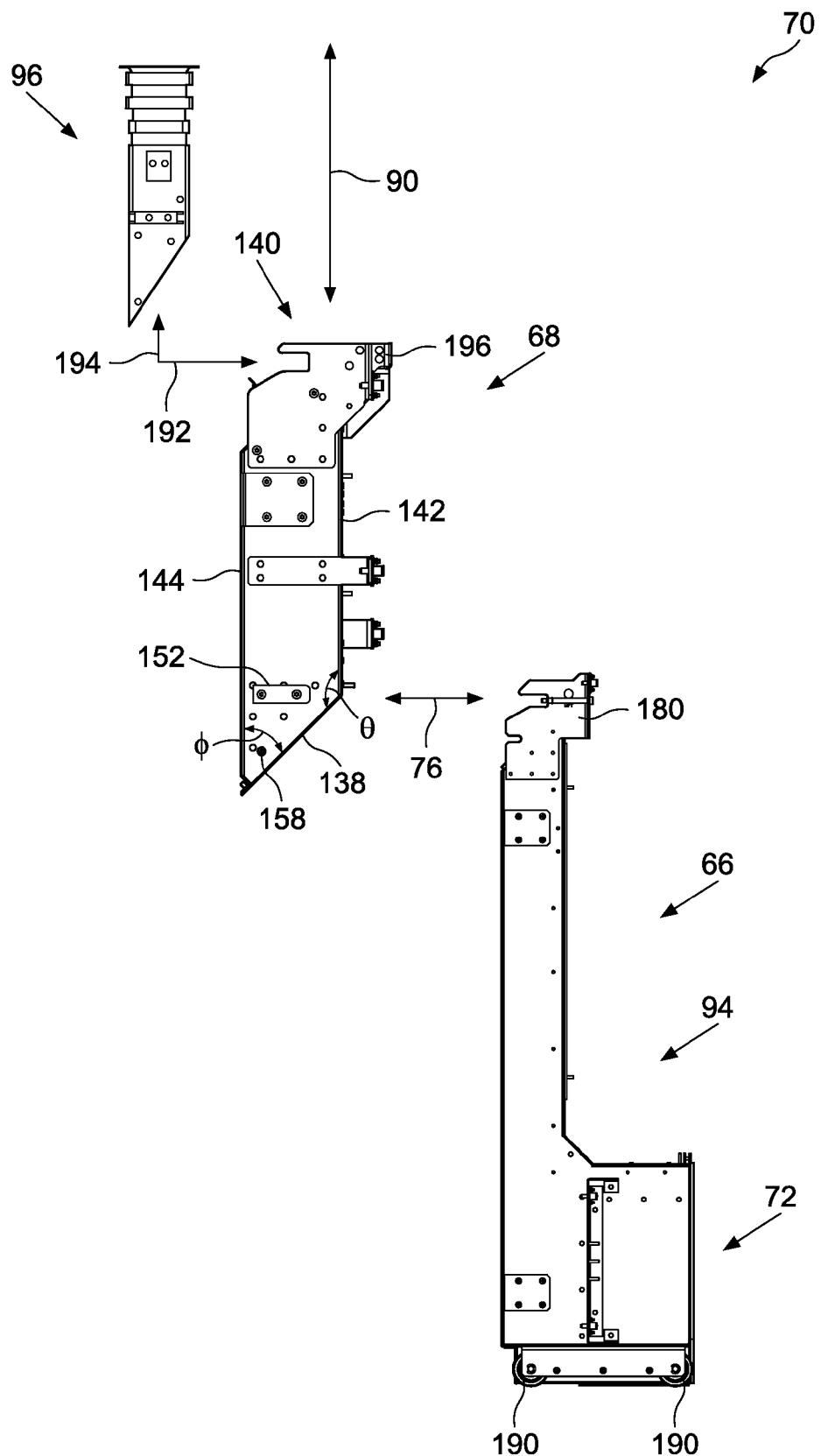
FIG. 8 is a side exploded view of an exemplary embodiment of the inverter duct, converter duct, inlet duct, and exhaust duct.

FIGS. 7 and 8 are perspective and side exploded views of an exemplary embodiment of the inverter duct 66, converter duct 68, inlet air duct 72, and exhaust duct 96. As illustrated by arrow 76, the inverter duct 66 and the inlet air duct 72 may be separated from the converter duct 68. In particular, as described above, the inverter duct 66 and the inlet air duct 72 may be rolled into and out of the cabinet 58 described above with respect to FIG. 3. To facilitate the rolling, the inlet air duct 72 may include wheels 190 that may be rolled onto an auxiliary cart or platform 80 with respect to FIG. 3. When the inverter duct 66 is rolled out of the cabinet 58, the brackets 180 of the inverter duct 66 are detached from the keys 152 and the alignment features 158 of the converter duct 68. Conversely, when the inverter duct 66 is rolled back into the cabinet 58, the brackets 180 of the inverter duct 66 are attached to the keys 152 and the alignment features 158 of the converter duct 68, providing both alignment and structural support of the inverter duct 66 with respect to the converter duct 68. Thus, by simply sliding the inverter duct 66 into the cabinet 58 and engaging the inverter duct 66 with the converter duct 68, the components function together to align and seal the first and second duct channel paths 128, 130.

In addition, as described in greater detail below, the exhaust duct 96 and the converter duct 68 may include similar attachment features as those between the inverter duct 66 and the converter duct 68. As illustrated by arrows 192 and 194, the exhaust duct 96 may be detached from the converter duct 68 and lifted through the top of the cabinet 58 of FIG. 3. In addition, once the exhaust duct 96 has been removed, the converter duct 68 may also be lifted through the top of the cabinet 58 of FIG. 3, as illustrated by arrow 90. In particular, in certain embodiments, the converter duct 68 may include a lifting bar 196 on the front wall 142 of the converter duct 68 near the downstream end 140 of the converter duct 68, which facilitates lifting of the converter duct 68 and attached ducts and/or components. When assembling the motor drive 60, the converter duct 68 may first be inserted back into the cabinet 58 of FIG. 3, as illustrated by arrow 90, and attached within the cabinet 58. Once the converter duct 68 has been inserted and attached, the exhaust duct 96 may be inserted back into the cabinet 58 of FIG. 3 and attached to the converter duct 68, as illustrated by arrow 194 and 192. However, in other embodiments, the converter duct 68 may be rolled into and out of the cabinet 58 of FIG. 3 while attached to the inverter duct 66 and the inlet air duct 72, and the exhaust duct 96 may remain in the cabinet 58.

Figure 9:
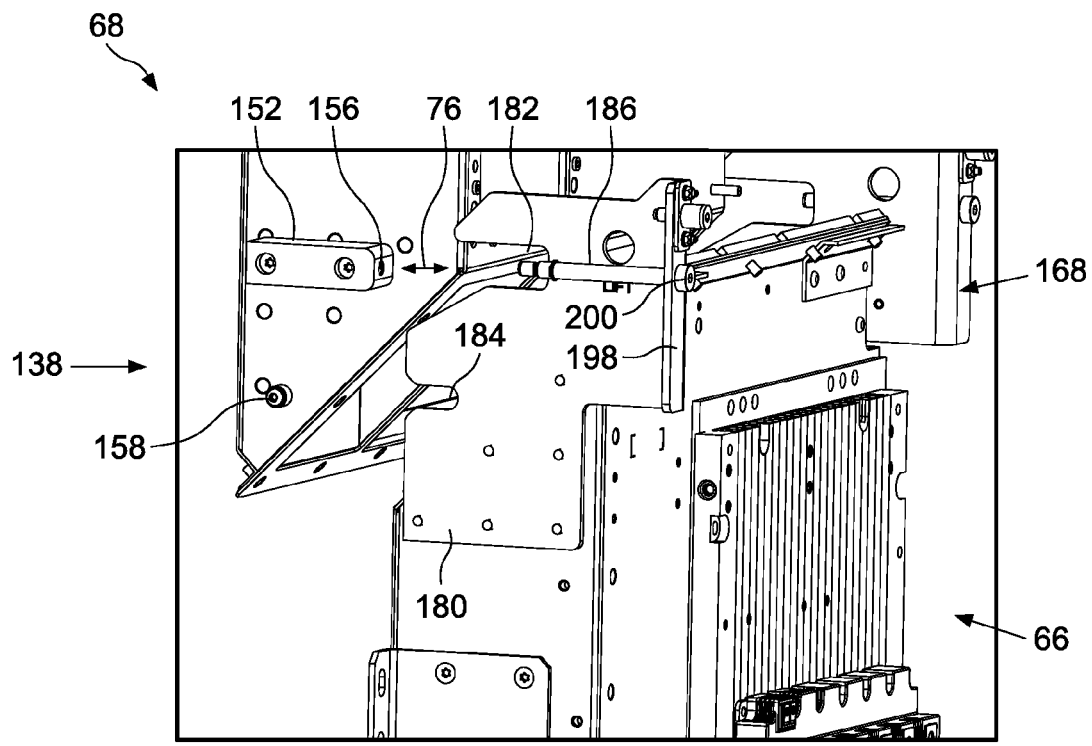
FIG. 9 is a partial perspective view of an exemplary embodiment of the inverter duct and the converter duct when detached from each other.
Figure 10:
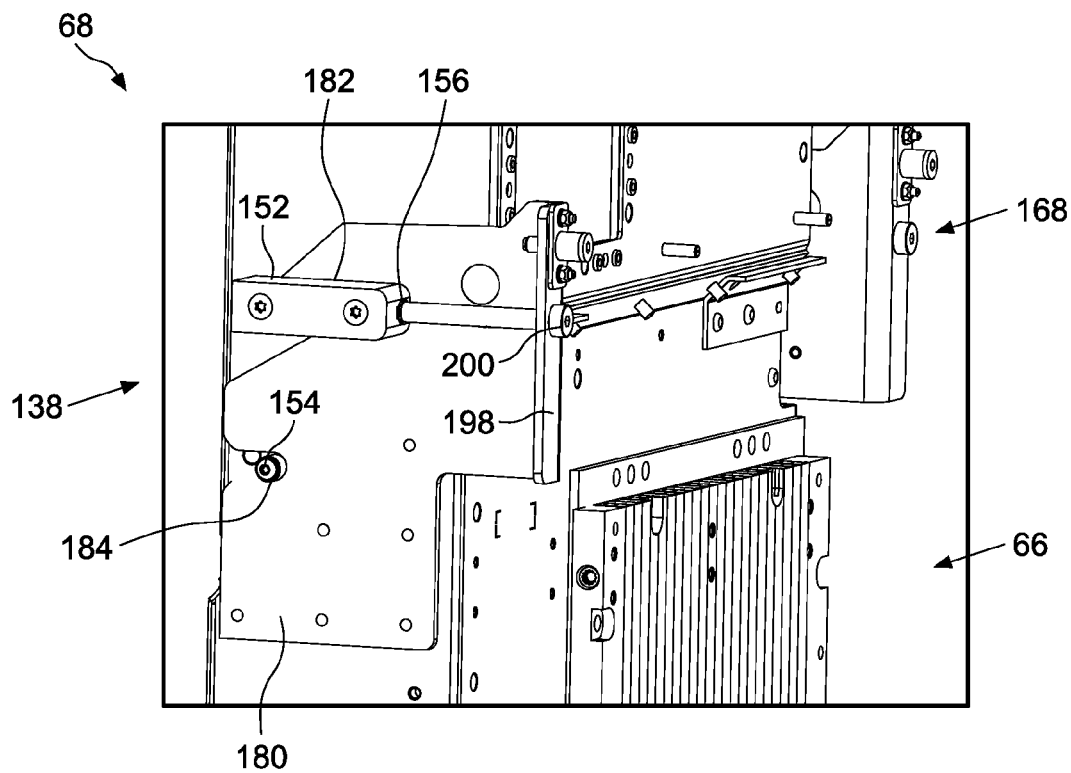
FIG. 10 is a partial perspective view of an exemplary embodiment of the inverter duct and the converter duct when attached to each other.

As described above, the inverter duct 66 and the converter duct 68 are attachable and detachable from each other at the downstream end 168 of the inverter duct 66 and the upstream end 138 of the converter duct 68. FIG. 9 is a partial perspective view of an exemplary embodiment of the inverter duct 66 and the converter duct 68 when detached from each other, and FIG. 10 is a partial perspective view of an exemplary embodiment of the inverter duct 66 and the converter duct 68 when attached to each other. As illustrated by arrow 76, the inverter duct 66 and the converter duct 68 may be attached and detached by aligning the generally rectangular-shaped keys 152 of the converter duct 68 with the generally rectangular-shaped slots 182 of the brackets 180 of the inverter duct 66, aligning the alignment features 158 of the converter duct 68 with the alignment slots 184 of the brackets 180 of the inverter duct 66, and inserting and attaching the pins 186 of the inverter duct 66 within the keyholes 156 of the keys 152 of the converter duct 68. In particular, the obround shape of the keys 152 facilitates the alignment of the inverter duct 66 with the converter duct 68. More specifically, because of the slightly rounded edges of the keys 152, slight variations in the alignment will be corrected relatively smoothly than if sharp edges were used. In addition, in other embodiments, trapezoidal-shaped keys 152 may be used with trapezoidal-shaped alignment slots 182. Although the majority of the brackets 180 are parallel with the right and left walls 174, 178 of the inverter duct 66, the brackets 180 may also include relatively narrow sections 198 that extend away from the inverter duct 66 orthogonal from the right and left walls 174, 178 of the inverter duct 66, wherein the narrow sections 198 are used to secure the inverter and converter ducts 66, 68 to the cabinet 58 of FIG. 3. The pins 186 may be inserted into holes 200 in the narrow bracket sections 198 before being inserted into and attached to the keyholes 156 of the keys 152 of the converter duct 68. Although described herein as being used in motor drive systems, the disclosed techniques for attaching air duct systems may be extended to other applications, such as heating, ventilation, and air conditioning (HVAC) applications.

Figure 11:
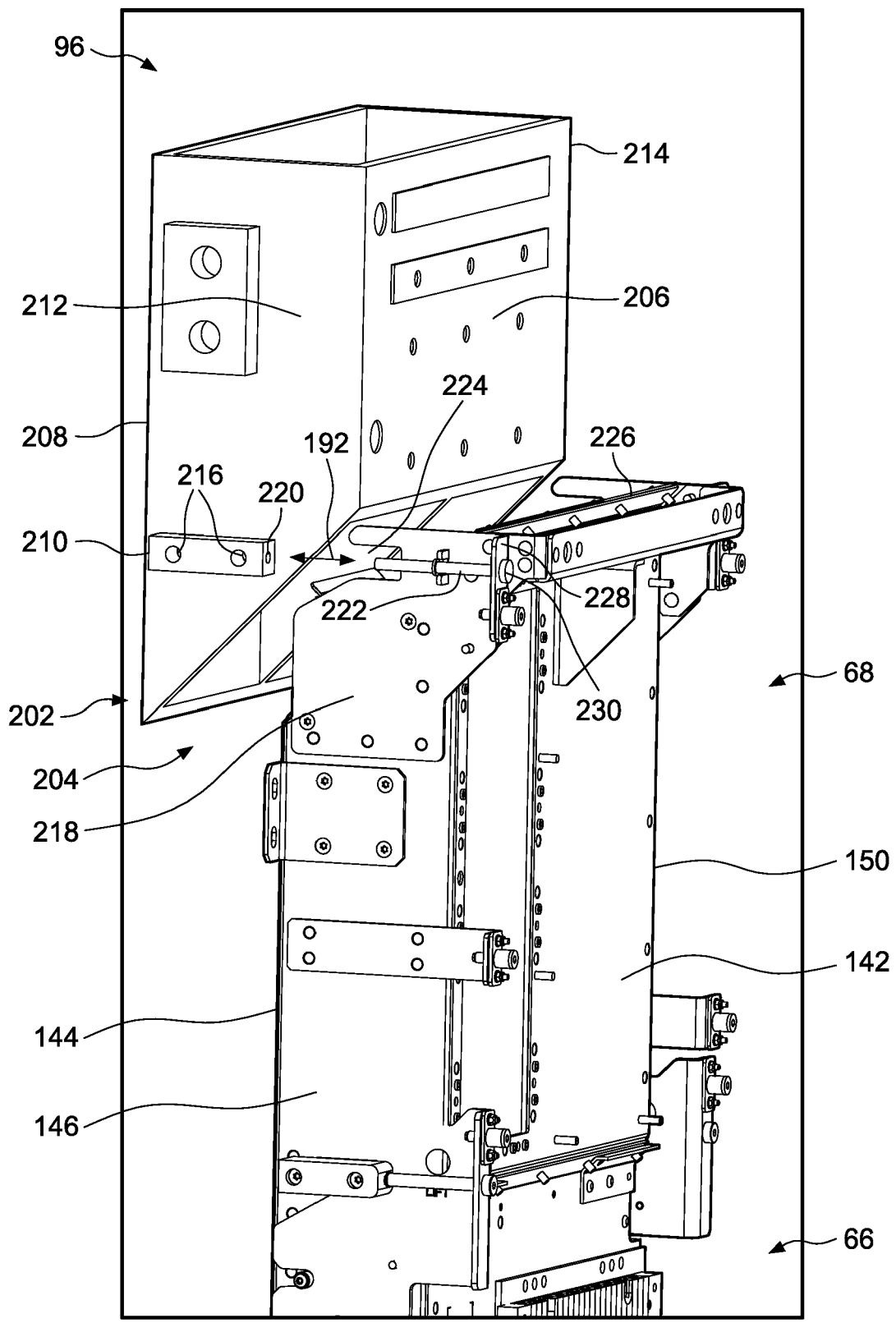
FIG. 11 is a partial perspective view of an exemplary embodiment of the exhaust duct, the converter duct, and the inverter duct.

As described above with respect to FIGS. 7 and 8, the exhaust duct 96 may also be detached from and attached to the converter duct 68. Indeed, in certain embodiments, the exhaust duct 96 and the converter duct 68 may also include attachment features similar to those used to attach the converter duct 68 and the inverter duct 66. FIG. 11 is a partial perspective view of an exemplary embodiment of the exhaust duct 96, the converter duct 68, and the inverter duct 66. As illustrated, the exhaust duct 96 includes an angled upstream end 202 that mates with a downstream end 204 of the converter duct 68. In particular, in certain embodiments, the upstream end 202 of the exhaust duct 96 extends out from a front wall 206 of the exhaust duct 96 to a back wall 208 of the exhaust duct 96 at an oblique angle (i.e., not a right angle). More specifically, the upstream end 202 of the exhaust duct 96 is at an obtuse angle (e.g., greater than 90° angle) with respect to the front wall 206 of the exhaust duct 96, and is at an acute angle (e.g., less than 90° angle) with respect to the back wall 208 of the exhaust duct 96. For example, in certain embodiments, the angle of the upstream end 202 with respect to the front wall 206 of the exhaust duct 96 is approximately 135°, whereas the angle of the upstream end 202 with respect to the back wall 208 of the exhaust duct 96 is approximately 45°. The 45° and 135° angles optimize the sealing of both the front wall 206 and the back wall 208 with the upstream end 202 of the exhaust duct 96.

The exhaust duct 96 includes generally rectangular-shaped or obround keys 210 attached to both left and right walls 212, 214 of the exhaust duct 96. In particular, in certain embodiments, the keys 210 are attached to the left and right walls 212, 214 of the exhaust duct 96 via two or more cap screws 216. The keys 210 are configured to mate with brackets 218 attached to the converter duct 68 to align the exhaust duct 96 with the converter duct 68 when the exhaust duct 96 and the converter duct 68 are assembled together. In addition, the keys 210 include keyholes 220 extending at least partially through the keys 210 from front to back. The keyholes 220 are configured to mate with pins 222 that help secure the exhaust duct 96 to the converter duct 68 when the exhaust duct 96 and the converter duct 68 are assembled together. Although not illustrated in the embodiment of FIG. 11, in certain embodiments, the exhaust duct 96 may also include at least one additional alignment feature extending from the left and right walls 212, 214 of the exhaust duct 96. The alignment features may also be configured to mate with the brackets 218 attached to the converter duct 68 to align the exhaust duct 96 with the converter duct 68 when the exhaust duct 96 and the converter duct 68 are assembled together.

As illustrated, the converter duct 68 includes an angled downstream end 204 that mates with the angled upstream end 202 of the exhaust duct 96 described above. In particular, in certain embodiments, the downstream end 204 of the converter duct 68 extends out from the back wall 144 of the converter duct 68 to the front wall 142 of the converter duct 68 at an oblique angle (i.e., not a right angle). More specifically, the downstream end 204 of the converter duct 68 is at an obtuse angle (e.g., greater than 90° angle) with respect to the back wall 144 of the converter duct 68, and is at an acute angle (e.g., less than 90° angle) with respect to the front wall 142 of the converter duct 68. For example, in certain embodiments, the angle of the downstream end 204 with respect to the back wall 144 of the converter duct 68 is approximately 135°, whereas the angle of the downstream end 204 with respect to the front wall 142 of the converter duct 68 is approximately 45°. The 45° and 135° angles (or, indeed, any suitable supplementary angles) optimize the sealing of both the front wall 142 and the back wall 144 with the downstream end 204 of the converter duct 68.

The converter duct 68 includes a bracket 218 attached to both the left and right walls 146, 150 of the converter duct 68. The brackets 218 constrain motion in orthogonal directions to ensure proper duct alignment and seal compression. In particular, the brackets 218 are configured to draw the exhaust duct 96 and the converter duct 68 into sealed engagement via a set of fasteners. The brackets 218 are integrated structural components of the duct system 70 and provide a path for load transfer during lifting of the motor drive 60. The brackets 218 are configured to mate with the keys 210 of the exhaust duct 96 described above. In particular, the brackets 218 include generally open-ended rectangular-shaped or obround slots 224 configured to mate with the generally rectangular-shaped keys 210 of the exhaust duct 96 to align the converter duct 68 with the exhaust duct 96 when the converter duct 68 and the exhaust duct 96 are assembled together. However, as described above, other shapes may be used for the keys 210 and the slots 224. In addition, although not illustrated in the embodiment of FIG. 11, the brackets 218 may also include alignment slots configured to mate with alignment features of the exhaust duct 96 to align the converter duct 68 with the exhaust duct 96 when the converter duct 68 and the exhaust duct 96 are assembled together.

Each of the brackets 218 may be associated with a respective pin 222. In particular, the pins 222 may be configured to mate with the keyholes 220 extending at least partially through the keys 210 of the exhaust duct 96. When the converter duct 68 and the exhaust duct 96 are assembled together, the pins 222 may be attached to the keys 210 of the exhaust duct 96, thereby securing the converter duct 68 to the exhaust duct 96. Any suitable attachment features may be used for the keyholes 220 of the keys 210 of the exhaust duct 96 and the pins 222 of the brackets 218 of the converter duct 68. For example, in certain embodiments, the keyholes 220 and the pins 222 may be threaded such that the pins 222 are screwed into the keyholes 220.

In addition, in certain embodiments, a gasket-like seal 226 may be attached to the downstream end 204 of the converter duct 68 such that the seal 226 separates the converter duct 68 from the exhaust duct 96 when the converter duct 68 and the exhaust duct 96 are assembled together. The seal 226 provides sealing capabilities that maintains the air flow through the first and second duct channel paths 128, 130 described above with respect to FIG. 4 with little to no leakage. In addition, the seal 226 prevents ingress of debris into the cabinet 58 of FIG. 3 from the first and second duct channel paths 128, 130, thereby protecting sensitive components in the cabinet 58. In particular, the seal 226 forms a NEMA 12/IP54 seal without the use of adhesive sealants, while also eliminating the need for restrictive intake filters. The seal 226 also includes gasket stops to prevent over compression and to transfer some of the loads between the converter duct 68 and the exhaust duct 96. In particular, in certain embodiments, the seal 226 is comprised of a generally compressible material, such as foam or the like.

As illustrated by arrow 192, the exhaust duct 96 and the converter duct 68 may be attached and detached by aligning the generally rectangular-shaped keys 210 of the exhaust duct 96 with the generally rectangular-shaped slots 224 of the brackets 218 of the converter duct 68, and inserting and attaching the pins 222 of the converter duct 68 within the keyholes 220 of the keys 210 of the exhaust duct 96. As described above, other shapes may be used for the keys 210 and the slots 224. Although the majority of the brackets 218 are parallel with the left and right walls 146, 150 of the converter duct 68, the brackets 218 also include relatively narrow sections 228 that extend away from the converter duct 68 orthogonal from the left and right walls 146, 150 of the converter duct 68, wherein the narrow sections 228 are used to secure the converter and exhaust ducts 68, 96 to the cabinet 58 of FIG. 3. The pins 222 are inserted into holes 230 in the narrow bracket sections 228 before being inserted into and attached to the keyholes 220 of the keys 210 of the exhaust duct 96.

As described above with respect to FIGS. 4 through 6, the first duct channel path 128 is dedicated to cooling the converter heat sink 132 associated with the converter 64, whereas the second duct channel path 130 is dedicated to cooling the inverter heat sink 160 associated with the inverter 62. In particular, the first converter duct channel 112 of the converter duct 68 houses the converter heat sink 132, and the second inverter duct channel 106 of the inverter duct 66 houses the inverter heat sink 160. More specifically, the heat sink fins 134 of the converter heat sink 132 are disposed within the first converter duct channel 112 of the converter duct 68, and the heat sink fins 162 of the inverter heat sink 160 are disposed within the second inverter duct channel 106.

Figures 12, 13:
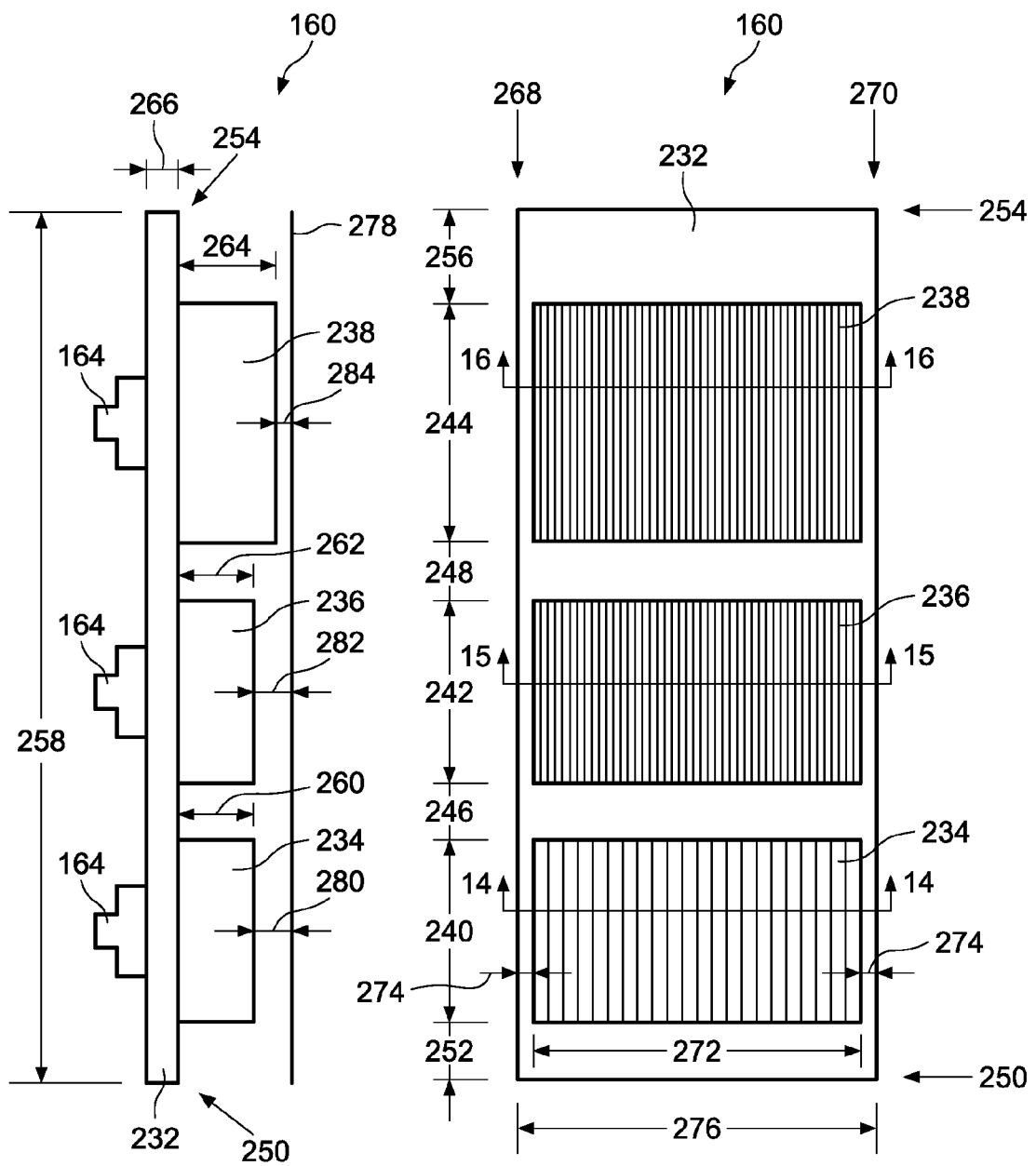
FIG. 12 is a side view of an exemplary embodiment of the inverter heat sink attached to the inverter components.
FIG. 13 is a top plan view of an exemplary embodiment of the inverter heat sink attached to the inverter components.

As described above, the inverter 62 and inverter heat sink 160 are sealingly attached to the inverter duct 66 such that the inverter duct 66 supports the inverter 62 when the inverter duct 66 is moved, and the inverter heat sink 160 provides a seal against the inverter duct 66. FIG. 12 is a side view of an exemplary embodiment of the inverter heat sink 160 attached to the inverter components 164 as viewed from the right wall 174 of the inverter duct 66 when the inverter heat sink 160 is sealingly attached to the inverter duct 66. Similarly, FIG. 13 is a top plan view of an exemplary embodiment of the inverter heat sink 160 as viewed from the back wall 170 of the inverter duct 66 when the inverter heat sink 160 is sealingly attached to the inverter duct 66. As illustrated in FIGS. 12 and 13, in certain embodiments, the inverter heat sink 160 may include three separate, sequential sections of heat sink fins 162 attached to a base 232 of the inverter heat sink 160. In particular, the illustrated inverter heat sink 160 includes first, second, and third heat sink fin sections 234, 236, 238 extending from the base 232, such that the three heat sink fin sections 234, 236, 238 generally correspond to and align with the three components 164 of the inverter 62. More specifically, the first, second, and third heat sink fin sections 234, 236, 238 generally correspond to and align with the W-phase, V-phase, and U-phase switching modules of the inverter 62, respectively, wherein the W-phase switching module is the bottom component 164 of the inverter 62, the V-phase switching module is the middle component 164 of the inverter 62, and the U-phase switching module is the top component 164 of the inverter 62. In certain embodiments, the inverter heat sink 160 includes a brazed fin aluminum construction.

As illustrated in FIGS. 12 and 13, each of the heat sink fin sections 234, 236, 238 include different heat sink fin geometries to optimize the flow of cooling air across the heat sink fins 162. More specifically, the length of the heat sink fins 162, the height of the heat sink fins 162, the number of heat sink fins 162, and the pitch between adjacent heat sink fins 162 may be different for the first, second, and third heat sink fin sections 234, 236, 238. As described in greater detail below with respect to FIG. 17, the different physical geometric characteristics between the three heat sink fin sections 234, 236, 238 ensure that working temperatures of the three components 164 of the inverter 62 are reduced and that temperature gradients between the three components 164 of the inverter 62 are maintained within an acceptable range.

For example, increasing the lengths of the heat sink fins 162 from the first heat sink fin section 234 to the second heat sink fin section 236 to the third heat sink fin section 238 may increase the heat transfer surface area, thereby enabling greater heat transfer flow from the components 164 of the inverter 62 toward downstream locations of the inverter heat sink 160. In addition, increasing the heights of the heat sink fins 162 from the first heat sink fin section 234 to the second heat sink fin section 236 to the third heat sink fin section 238 may increase the flow rate of cooling air across the heat sink fins 162 toward downstream locations of the inverter heat sink 160. Furthermore, increasing the number of heat sink fins 162 and decreasing the pitch between adjacent heat sink fins 162 from the first heat sink fin section 234 to the second heat sink fin section 236 to the third heat sink fin section 238 may also increase the heat transfer surface area, again enabling greater heat transfer flow from the components 164 of the inverter 62 toward downstream locations of the inverter heat sink 160. Each of these effects may counteract the fact that the cooling air will gradually increase in temperature as it flows across the first, second, and third heat sink fin sections 234, 236, 238.

As described above, the heat sink fin sections 234, 236, 238 may have different lengths. In particular, a first length 240 of the first heat sink fin section 234 may be different from a second length 242 of the second heat sink fin section 236, which may be different than a third length 244 of the third heat sink fin section 238. For example, in certain embodiments, the first length 240 of the first heat sink fin section 234 may be approximately 154 mm, the second length 242 of the second heat sink fin section 236 may be approximately 150 mm, and the third length 244 of the third heat sink fin section 238 may be approximately 195 mm. However, in other embodiments, these dimensions may vary depending on the air flow requirements of the inverter heat sink 160. In general, the third length 244 of the third heat sink fin section 238 may be substantially greater than the first and second lengths 240, 242 of the first and second heat sink fin sections 234, 236. For example, in certain embodiments, the third length 244 of the third heat sink fin section 238 may be approximately 30% greater than the first and second lengths 240, 242 of the first and second heat sink fin sections 234, 236. The greater length 244 of the third heat sink fin section 238 may increase the heat transfer surface area of the third heat sink fin section 238, thereby enabling greater heat transfer flow through the third heat sink fin section 238.

In addition, each of the heat sink fin sections 234, 236, 238 may be separated from each other lengthwise along the base 232 of the inverter heat sink 160. In particular, the first heat sink fin section 234 may be separated from the second heat sink fin section 236 by a distance 246, and the second heat sink fin section 236 may be separated from the third heat sink fin section 238 by a distance 248. For example, in certain embodiments, the distance 246 between the first heat sink fin section 234 and the second heat sink fin section 236 may be approximately 40 mm, and the distance 248 between the second heat sink fin section 236 and the third heat sink fin section 238 may be approximately 50 mm. In addition, in certain embodiments, the first heat sink fin section 234 may be separated from a leading edge 250 of the base 232 of the inverter heat sink 160 by a distance 252 of approximately 30 mm, and the third heat sink fin section 238 may be separated from a trailing edge 254 of the base 232 of the inverter heat sink 160 by a distance 256 of approximately 70 mm such that the total length 258 of the base 232 of the inverter heat sink 160 is approximately 690 mm. However, in other embodiments, these absolute and relative dimensions may vary depending on the air flow requirements of the inverter heat sink 160. The separation distances 246, 248 between heat sink fin sections 234, 236, 238 improve heat transfer by stripping the thermal boundary layer that builds up in the flow direction.

In addition, as described above, the heat sink fin sections 234, 236, 238 may have different heights from the base 232 of the inverter heat sink 160. In particular, a first height 260 of the first heat sink fin section 234 may be different from a second height 262 of the second heat sink fin section 236, which may be different from a third height 264 of the third heat sink fin section 238. For example, in certain embodiments, the first height 260 of the first heat sink fin section 234 may be approximately 54 mm, the second height 262 of the second heat sink fin section 236 may be approximately 63 mm, and the third height 264 of the third heat sink fin section 238 may be approximately 78 mm. However, in other embodiments, these dimensions may vary depending on the air flow requirements of the inverter heat sink 160. In general, the third height 264 of the third heat sink fin section 238 is substantially greater than the second height 262 of the second heat sink fin section 236, which is in turn substantially greater than the first height 260 of the first heat sink fin section 234. For example, in certain embodiments, the second height 262 of the second heat sink fin section 236 may be approximately 15-25% greater than the first height 260 of the first heat sink fin section 234, and the third height 264 of the third heat sink fin section 238 may be approximately 20-30% greater than the second height 262 of the second heat sink fin section 236. The gradually increasing heights 260, 262, 264 of the first, second, and third heat sink fin sections 234, 236, 238 may gradually increase the flow rate of cooling air across the heat sink fins 162 from the first heat sink fin section 234 to the second heat sink fin section 236 to the third heat sink fin section 238. The gradually increasing heights 260, 262, 264 of the first, second, and third heat sink fin sections 234, 236, 238 also increase the heat transfer surface area from the first heat sink fin section 234 to the second heat sink fin section 236 to the third heat sink fin section 238. In addition, in certain embodiments, the thickness 266 of the base 232 of the inverter heat sink 160 may be approximately 14 mm.

Figure 14:
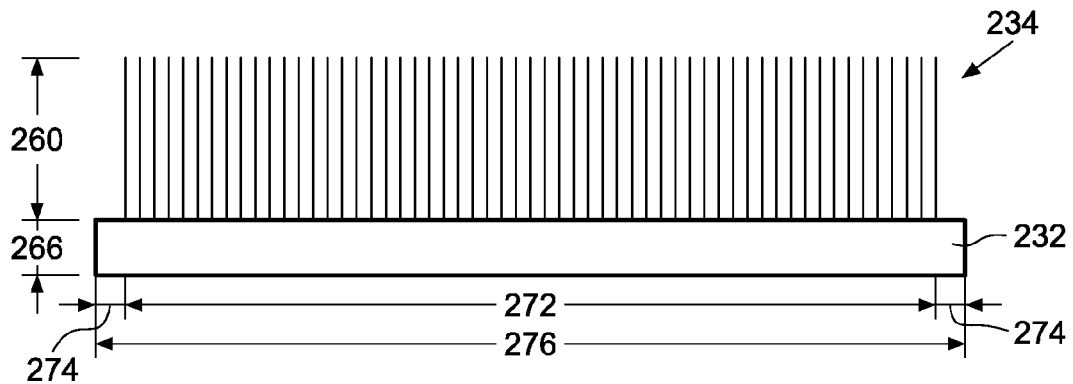
FIG. 14 is a cross-sectional side view of an exemplary embodiment of the first heat sink fin section of the inverter heat sink.
Figure 15:
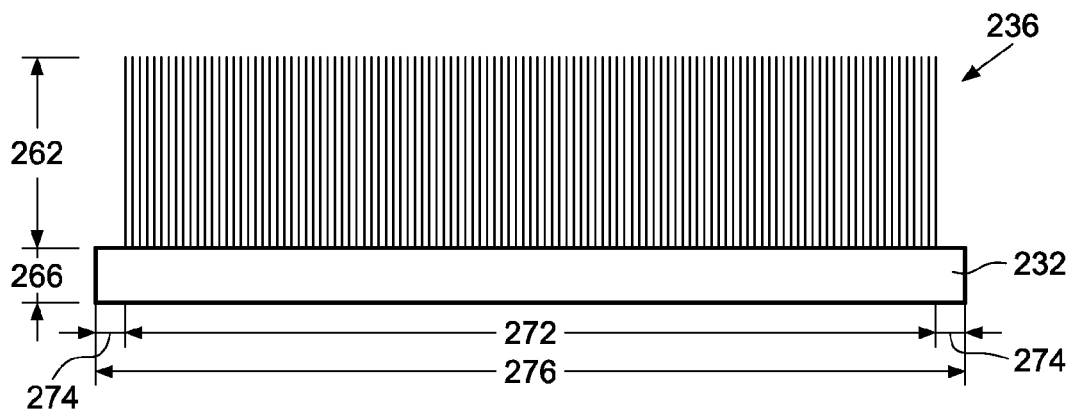
FIG. 15 is a cross-sectional side view of an exemplary embodiment of the second heat sink fin section of the inverter heat sink.
Figure 16:
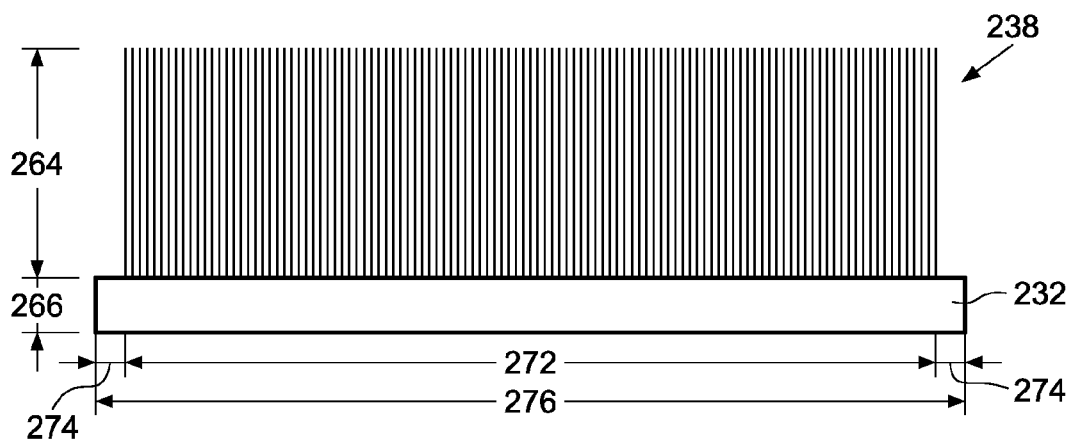
FIG. 16 is a cross-sectional side view of an exemplary embodiment of the third heat sink fin section of the inverter heat sink.

FIGS. 14 through 16 are cross-sectional side views of exemplary embodiments of the first, second, and third heat sink fin sections 234, 236, 238 of the inverter heat sink 160 as viewed from the upstream end 166 of the inverter duct 66 when the inverter heat sink 160 is sealingly attached to the inverter duct 66. As described above, the heat sink fin sections 234, 236, 238 may have different fin counts and pitches between adjacent heat sink fins 162. In other words, the density of the heat sink fins 162 of the heat sink fin sections 234, 236, 238 may vary from a first side 268 of the base 232 of the inverter heat sink 160 to a second side 270 of the base 232 of the inverter heat sink 160. For example, in certain embodiments, the first heat sink fin section 234 may include approximately 50 heat sink fins 162 having approximately 0.8 mm widths and being separated from adjacent heat sink fins 162 by approximately 4 mm, and the second and third heat sink fin sections 236, 238 may include approximately 100 heat sink fins 162 having approximately 0.8 mm widths and being separated from adjacent heat sink fins 162 by approximately 2 mm. However, in other embodiments, these absolute and relative dimensions may vary depending on the air flow requirements of the inverter heat sink 160. In addition, in certain embodiments, the cross-sectional profiles of the heat sink fins 162 of the first, second, and third heat sink fin sections 234, 236, 238 may vary. For example, the cross-sectional profiles of the heat sink fins 162 of the first heat sink fin section 234 may be different than the cross-sectional profiles of the heat sink fins 162 of the second heat sink fin section 236, which may be different than the cross-sectional profiles of the heat sink fins 162 of the third heat sink fin section 238.

In general, the pitch of the heat sink fins 162 of the second and third heat sink fin sections 236, 238 may be substantially smaller than the pitch of the heat sink fins 162 of the first heat sink fin section 234. In other words, the density of heat sink fins 162 for the second and third heat sink fin sections 236, 238 may be substantially higher than the density of heat sink fins 162 for the first heat sink fin section 234. For example, in certain embodiments, the second and third heat sink fin sections 236, 238 may employ twice as many heat sink fins 162 as the first heat sink fin section 234. The higher fin density of the second and third heat sink fin sections 236, 238 may increase the heat transfer surface area of the second and third heat sink fin sections 236, 238, thereby enabling greater heat transfer flow through the second and third heat sink fin sections 236, 238. In addition, in certain embodiments, the width 272 of the heat sink fin sections 234, 236, 238 may be approximately 280 mm, and the distances 274 from the heat sink fin sections 234, 236, 238 to the first and second sides 268, 270 of the base 232 of the inverter heat sink 160 may be approximately 10 mm such that the width 276 of the base 232 of the inverter heat sink 160 is approximately 300 mm. However, in other embodiments, these dimensions may vary depending on the air flow requirements of the inverter heat sink 160.

Returning now to FIG. 12, as illustrated, the three distinct heat sink fin sections 234, 236, 238 may each be positioned away from a substantially planar wall 278 that it parallel to the base 232 of the inverter heat sink 160. However, in other embodiments, the planar wall 278 may not be parallel to the base 232 of the inverter heat sink 160. The cooling air used to dissipate and carry away heat from the inverter heat sink 160 flows between the base 232 of the inverter heat sink 160 and the wall 278. In certain embodiments, the wall 278 may be the back wall 170 of the inverter duct 66. However, in other embodiments, a separate wall may be located within the inverter duct 66 between the inverter heat sink 160 and the back wall 170 of the inverter duct 66. Regardless, due to the gradually increasing heights 260, 262, 264 of the heat sink fin sections 234, 236, 238, the distances from the heat sink fins 162 of the heat sink fin sections 234, 236, 238 to the wall 278 will gradually decrease. More specifically, a distance 280 from the heat sink fins 162 of the first heat sink fin section 234 to the wall 278 will be greater than a distance 282 from the heat sink fins 162 of the second heat sink fin section 236 to the wall 278, which will in turn be greater than a distance 284 from the heat sink fins 162 of the third heat sink fin section 238 to the wall 278. For example, in certain embodiments, the distance 280 from the heat sink fins 162 of the first heat sink fin section 234 to the wall 278 will be approximately 30 mm, the distance 282 from the heat sink fins 162 of the second heat sink fin section 236 to the wall 278 will be approximately 21 mm, and the distance 284 from the heat sink fins 162 of the third heat sink fin section 238 will be approximately 6 mm. In other words, in certain embodiments, the distance 282 from the heat sink fins 162 of the second heat sink fin section 236 to the wall 278 may be approximately 70% of the distance 280 from the heat sink fins 162 of the first heat sink fin section 234 to the wall 278, and the distance 284 from the heat sink fins 162 of the third heat sink fin section 238 to the wall 278 may be approximately 25-30% of the distance 282 from the heat sink fins 162 of the second heat sink fin section 236 to the wall 278. However, in other embodiments, these absolute and relative dimensions may vary depending on the air flow requirements of the inverter heat sink 160. The gaps (e.g., distances 280, 282, 284) permit fresh air at ambient temperatures to bypass the first heat sink fin section 234 and, when desired, the second heat sink fin section 236 to provide cooler fresh air to the second and third heat sink fin sections 236, 238, thereby reducing the bulk average air temperature. The gaps 280, 282, 284 also reduce the fluid pressure drop. Thus, the gaps 280, 282, 284 may be sized to improve thermal performance and reduce fan power.

Figure 17:
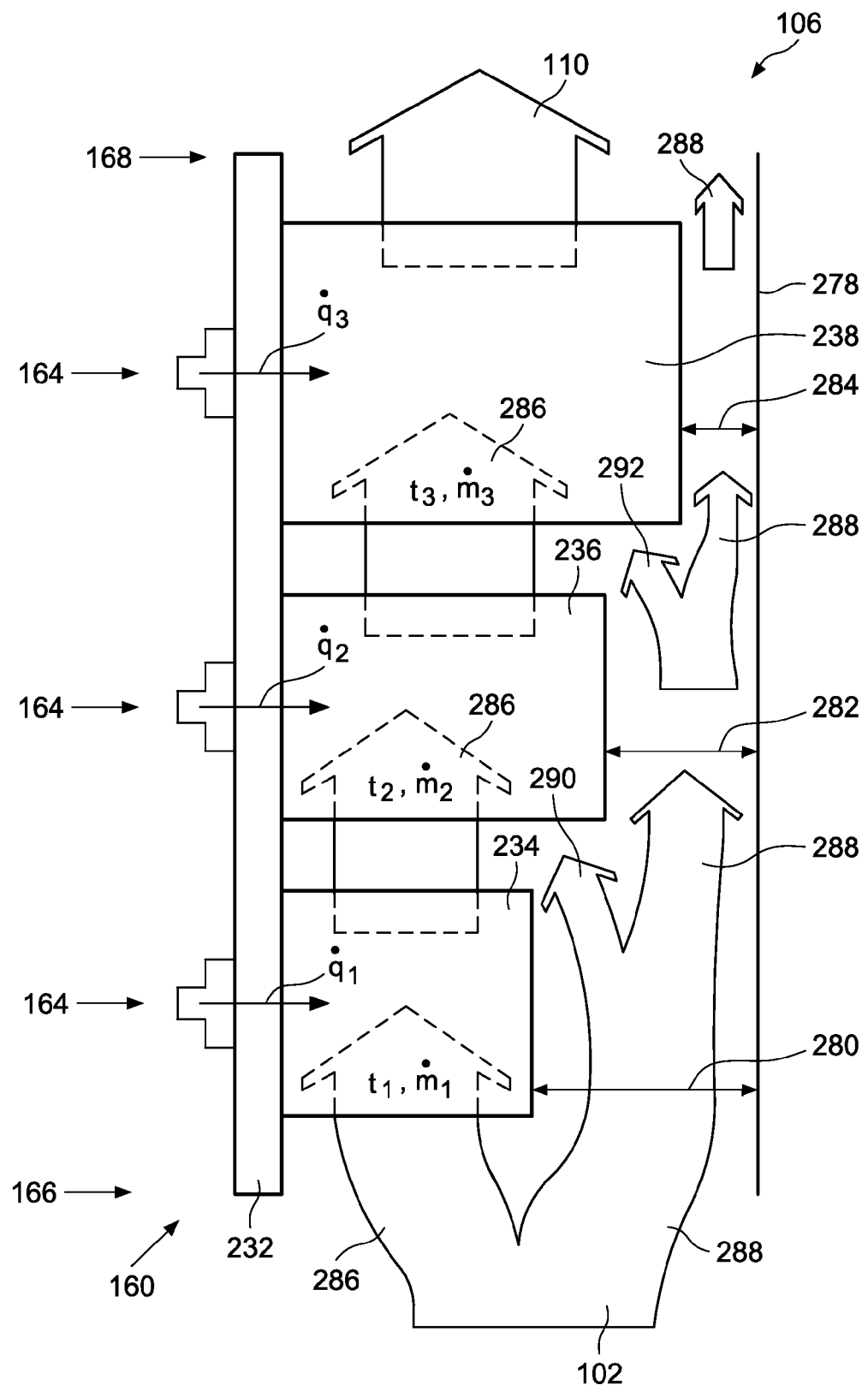
FIG. 17 is a conceptual side view of an exemplary embodiment of the inverter heat sink of FIGS. 12 through 16.

FIG. 17 is a conceptual side view of an exemplary embodiment of the inverter heat sink 160 of FIGS. 12 through 16, illustrating how cooling air flows are directed across and between the heat sink fins 162 of the first, second, and third heat sink fin sections 234, 236, 238 between the base 232 of the inverter heat sink 160 and the wall 278. It should be noted that the relative dimensions illustrated in FIG. 17 are somewhat exaggerated in order to illustrate how the cooling air flows are affected by the different geometries of the first, second, and third heat sink fin sections 234, 236, 238. As illustrated, a heat sink portion 286 of the cooling air 102 flowing into the second inverter duct channel 106 may directly flow across and between the heat sink fins 162 of the first heat sink fin section 234, whereas a bypass portion 288 of the cooling air 102 flowing into the second inverter duct channel 106 may bypass the heat sink fins 162 of the first heat sink fin section 234 through the distance 280 between the heat sink fins 162 of the first heat sink fin section 234 and the wall 278.

A first portion 290 of the bypass portion 288 of cooling air may rejoin the heat sink portion 286 between first and second heat sink fin sections 234, 236 whereas some of the bypass portion 288 of cooling air may continue to bypass the heat sink fins 162 of the second heat sink fin section 236 through the distance 282 between the heat sink fins 162 of the second heat sink fin section 236 and the wall 278. In addition, a second portion 292 of the bypass portion 288 of cooling air may rejoin the heat sink portion 286 between the second and third heat sink fin sections 236, 238 whereas some of the bypass portion 288 of cooling air may continue to bypass the heat sink fins 162 of the third heat sink fin section 238 through the distance 284 between the heat sink fins 162 of the third heat sink fin section 238 and the wall 278. Finally, the remainder of the bypass portion 288 of cooling air may exit the second inverter duct channel 106. As such, more cooling air is directed across and between the heat sink fins 162 of the downstream heat sink fin sections 234, 236, 238 than the upstream heat sink fin sections 234, 236, 238. More specifically, the volume of cooling air flowing across and between the heat sink fins 162 of the third heat sink fin section 238 will be greater than the volume of cooling air flowing across and between the heat sink fins 162 of the second heat sink fin section 236, which in turn is greater than the volume of cooling air flowing across and between the heat sink fins 162 of the first heat sink fin section 234. Indeed, in certain embodiments, substantially all of the cooling air 102 flowing into the second inverter duct channel 106 will flow across and between the heat sink fins 162 of the third heat sink fin section 238.

In general, an objective is to reduce temperatures and maintain temperature gradients from the upstream end 166 of the inverter heat sink 160 to the downstream end 168 of the inverter heat sink 160. One way to do this is to ensure that the flow rates of heat $\dot{q}_1$, $\dot{q}_2$, and $\dot{q}_3$ through the first, second, and third heat sink fin sections 234, 236, 238 are all substantially equal. However, the temperatures $t_1$, $t_2$, and $t_3$ of the heat sink portion 286 of cooling air increase from the first heat sink fin section 234 to the second heat sink fin section 236 to the third heat sink fin section 238 as heat from the heat sink fins 162 are dissipated and carried away. As such, because the temperature of the cooling air is greater for each successive heat sink fin section 234, 236, 238, the ability of each successive heat sink fin section 234, 236, 238 to cool the heat sink fins 162 and ensure equal flow rates of heat $\dot{q}_1$, $\dot{q}_2$, and $\dot{q}_3$ is diminished. In other words, the third heat sink fin section 238 may otherwise be unable to maintain a flow rate of heat $\dot{q}_3$ that is equal to the flow rate of heat $q_2$ through the second heat sink fin section 236 because the temperature $t_3$ of the heat sink portion 286 of cooling air is greater near the third heat sink fin section 238 than the temperature $t_2$ of the heat sink portion 286 of cooling air near the second heat sink fin section 236. Similarly, the second heat sink fin section 236 may otherwise be unable to maintain a flow rate of heat $\dot{q}_2$ that is equal to the flow rate of heat $\dot{q}_1$ through the first heat sink fin section 234 because the temperature $t_2$ of the heat sink portion 286 of cooling air is greater near the second heat sink fin section 236 than the temperature $t_1$ of the heat sink portion 286 of cooling air near the first heat sink fin section 234.

However, this may be at least partially offset due to the different geometries of the first, second, and third heat sink fin sections 234, 236, 238. For example, because the distances 280, 282, 284 between the heat sink fins 162 of the first, second, and third heat sink fin sections 234, 236, 238 gradually decrease as the cooling air flows through the second inverter duct channel 106, more cooling air is directed across the heat sink fins 162 for each successive heat sink fin section 234, 236, 238. More specifically, the flow rate $\dot{m}_3$ of the heat sink portion 286 of cooling air across and between the heat sink fins 162 of the third heat sink fin section 238 is greater than the flow rate $\dot{m}_2$ of the heat sink portion 286 of cooling air across and between the heat sink fins 162 of the second heat sink fin section 236, which is in turn greater than the flow rate $\dot{m}_1$ of the heat sink portion 286 of cooling air across and between the heat sink fins 162 of the first heat sink fin section 234. In addition, the bypass air entering the second and third heat sink fin sections 236, 238 reduces the bulk average fluid temperatures $t_2$ and $t_3$, thus improving the flow rates of heat $\dot{q}_2$, and $\dot{q}_3$ through the second and third heat sink fin sections 236, 238. As such, the flow rates of heat $\dot{q}_1$, $\dot{q}_2$, and $\dot{q}_3$ through the first, second, and third heat sink fin sections 234, 236, 238 may remain relatively equal despite the increasing temperatures $t_1$, $t_2$, and $t_3$ of the heat sink portion 286 as it flows through the second inverter duct channel 106.

In summary, because of heat transfer from the heat sink fins 162, the cooling air 102, 110 may gradually increase in temperature as it flows through the second inverter duct channel 106. However, this increase in temperature may be at least partially offset because more cooling air 102, 110 is directed to flow directly between the heat sink fins 162 at downstream locations. More specifically, because the heat sink fins 162 increasingly occupy a greater cross-sectional area of the second inverter duct channel 106 from the upstream end 166 of the second inverter duct channel 106 to the downstream end 168 of the second inverter duct channel 106, increasingly more cooling air 102, 110 flows across the heat sink fins 162. In addition, more heat sink fins 162 are used in the downstream heat sink fin sections 236, 238 and the third heat sink fin section 238 is longer than the first and second heat sink fin sections 234, 236. As such, the heat transfer surface area is increased for each successive heat sink fin section 234, 236, 238. In addition, lower fan power (e.g., for the blower 74) is used in conjunction with the present embodiments because the effective air flow resistance is reduced. In addition, the planar wall 278 of the present embodiments is less expensive than other types of walls, such as stepped plate walls, because of the flat nature of the wall 278. Thus, the wall 278 in combination with the varying heights 260, 262, 264 of the first, second, and third heat sink fin sections 234, 236, 238 creates the variable bypass gaps 280, 282, 284 less expensively and with greater heat sink fin area heat transfer utilization than other designs. As such, the present embodiments make efficient use of fin material by using only as much heat sink fin area as necessary for the load.

As a result of employing the first, second, and third heat sink fin sections 234, 236, 238 as discussed above, more cooling air is used to dissipate heat from the inverter heat sink 160 for downstream components 164 of the inverter 62 than for upstream components 164 of the inverter 62, thereby reducing temperature gradients from the upstream components 164 of the inverter 62 to the downstream components 164 of the inverter 62. More specifically, because of the optimization of the ratios of length, height, number, and pitch of the heat sink fins 162 of the first, second, and third heat sink fin sections 234, 236, 238, the disclosed embodiments may enable the temperature gradient to be maintained within 5° F. (e.g., from the upstream end 166 of the second inverter duct channel 106 to the downstream end 168 of the second inverter duct channel 106). In certain embodiments, the converter heat sink 132 may also use separate, sequential heat sink fin sections having different physical geometric characteristics as described above with respect to FIGS. 12 through 17.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power electronic system, comprising:
a cooling air duct that, in operation, channels a flow of cooling air;
first, second, and third power electronic switching modules that, in operation, perform controlled switching of respective first, second, and third phases of AC power, the power electronic switching modules being disposed adjacent to the cooling air duct;
first, second, and third heat sink sections disposed adjacent to the first, second, and third power electronic switching modules and extending into the cooling air duct in a sequential configuration wherein the second heat sink section receives cooling air from the first heat sink section, and the third heat sink section receives cooling air from the second heat sink section, each of the first, second, and third heat sink sections being physically configured differently from the other heat sink sections to reduce a working temperature of the respective power electronic switching module and to reduce working temperature differences between the power electronic switching modules, wherein the first, second, and third heat sink sections comprise respective first, second, and third sets of fins having first, second, and third lengths, respectively, the third length being greater than the first and second lengths; and
means for moving the cooling air through the cooling air duct and across the first, second, and third heat sink sections.

2. The system of claim 1, wherein the first, second, and third power electronic switching modules comprise a power inverter.

3. The system of claim 1, wherein the first, second, and third sets of fins extend into the cooling air duct first, second, and third distances, respectively, the first distance being less than the second distance, and the second distance being less than the third distance.

4. The system of claim 1, wherein the first, second, and third sets of fins have first, second, and third pitches, respectively, the first pitch being greater than the second and third pitches.

5. The system of claim 1, wherein the first, second, and third heat sink sections, in operation, provide substantially equal flow rates of heat from the respective power electronic switching module.

6. The system of claim 1, wherein the first, second, and third heat sink sections share a common base.

7. A power electronic system, comprising:
a cooling air duct that, in operation, channels a flow of cooling air;
first, second, and third power electronic switching modules that, in operation, perform controlled switching of respective first, second, and third phases of AC power, the power electronic switching modules being disposed adjacent to the cooling air duct;
first, second, and third heat sink sections disposed adjacent to the first, second, and third power electronic switching modules and extending into the cooling air duct in a sequential configuration wherein the second heat sink section receives cooling air from the first heat sink section, and the third heat sink section receives cooling air from the second heat sink section, each of the first, second, and third heat sink sections being physically configured differently from the other heat sink sections to reduce a working temperature of the respective power electronic switching module and to reduce working temperature differences between the power electronic switching modules; and
means for moving the cooling air through the cooling air duct and across the first, second, and third heat sink sections;
wherein the first heat sink section extends a first distance into the cooling air duct to permit a first cooling air stream to flow through the first heat sink section and a first bypass air stream to flow between the first heat sink section and a rear wall of the cooling air duct, the second heat sink section extends a second distance into the cooling air duct greater than the first distance to permit the first cooling air stream and a portion of the first bypass air stream to flow through the second heat sink section and a second bypass air stream to flow between the second heat sink section and the rear wall of the cooling air duct, and the third heat sink section extends a third distance into the cooling air duct greater than the second distance to permit cooling air from the second heat sink section and at least a portion of the second bypass air stream to flow through the third heat sink section.

8. The system of claim 7, wherein substantially all of the cooling air flows through the third heat sink section.

9. The system of claim 7, wherein the rear wall is substantially planar.

10. The system of claim 7, wherein the first, second, and third heat sink sections comprise respective first, second, and third sets of fins having first, second, and third lengths, respectively, the third length being greater than the first and second lengths.

11. The system of claim 7, wherein the first, second, and third heat sink sections comprise respective first, second, and third sets of fins having first, second, and third pitches, respectively, the first pitch being greater than the second and third pitches.

12. The system of claim 7, wherein the first, second, and third heat sink sections, in operation, provide substantially equal flow rates of heat from the respective power electronic switching module.

13. The system of claim 7, wherein the first, second, and third heat sink sections share a common base.

14. A method for making a power electronic system, comprising:
disposing first, second, and third power electronic switching modules adjacent to a cooling air duct, wherein the first, second, and third power electronic switching modules, in operation, perform controlled switching of respective first, second, and third phases of AC power; and
disposing first, second, and third heat sink sections adjacent to the first, second, and third power electronic switching modules, the first, second, and third heat sink sections extending into the cooling air duct in a sequential configuration wherein the second heat sink section receives cooling air from the first heat sink section, and the third heat sink section receives cooling air from the second heat sink section, each of the first, second, and third heat sink sections being physically configured differently from the other heat sink sections to reduce a working temperature of the respective power electronic switching module and to reduce working temperature differences between the power electronic switching modules;
wherein the first heat sink section extends a first distance into the cooling air duct to permit a first cooling air stream to flow through the first heat sink section and a first bypass air stream to flow between the first heat sink section and a rear wall of the cooling air duct, the second heat sink section extends a second distance into the cooling air duct greater than the first distance to permit the first cooling air stream and a portion of the first bypass air stream to flow through the second heat sink section and a second bypass air stream to flow between the second heat sink section and the rear wall of the cooling air duct, and the third heat sink section extends a third distance into the cooling air duct greater than the second distance to permit cooling air from the second heat sink section and at least a portion of the second bypass air stream to flow through the third heat sink section.

15. The method of claim 14, comprising disposing, adjacent to an end of the cooling air duct, means for moving the cooling air through the cooling air duct and across the first, second, and third heat sink sections.

16. The method of claim 14, wherein the first, second, and third heat sink sections comprise respective first, second, and third sets of fins having first, second, and third lengths, respectively, the third length being greater than the first and second lengths.

17. The method of claim 14, wherein the first, second, and third heat sink sections comprise respective first, second, and third sets of fins having first, second, and third pitches, respectively, the first pitch being greater than the second and third pitches.

18. A power electronic system, comprising:
a cooling air duct that, in operation, channels a flow of cooling air;
first, second, and third power electronic switching modules that, in operation, perform controlled switching of respective first, second, and third phases of AC power, the power electronic switching modules being disposed adjacent to the cooling air duct;
first, second, and third heat sink sections disposed adjacent to the first, second, and third power electronic switching modules and extending into the cooling air duct in a sequential configuration wherein the second heat sink section receives cooling air from the first heat sink section, and the third heat sink section receives cooling air from the second heat sink section, each of the first, second, and third heat sink sections being physically configured differently from the other heat sink sections to reduce a working temperature of the respective power electronic switching module and to reduce working temperature differences between the power electronic switching modules, wherein the first, second, and third heat sink sections comprise respective first, second, and third sets of fins having first, second, and third pitches, respectively, the first pitch being greater than the second and third pitches; and
means for moving the cooling air through the cooling air duct and across the first, second, and third heat sink sections.

19. The system of claim 18, wherein the first, second, and third power electronic switching modules comprise a power inverter.

20. The system of claim 18, wherein the first, second, and third sets of fins extend into the cooling air duct first, second, and third distances, respectively, the first distance being less than the second distance, and the second distance being less than the third distance.

21. The system of claim 18, wherein the first, second, and third sets of fins have first, second, and third lengths, respectively, the third length being greater than the first and second lengths.

22. The system of claim 18, wherein the first, second, and third heat sink sections, in operation, provide substantially equal flow rates of heat from the respective power electronic switching module.

23. The system of claim 18, wherein the first, second, and third heat sink sections share a common base.

* * * * *